United States Patent
Bischoff et al.

(10) Patent No.: US 6,804,005 B2
(45) Date of Patent: Oct. 12, 2004

(54) OVERLAY MEASUREMENTS USING ZERO-ORDER CROSS POLARIZATION MEASUREMENTS

(75) Inventors: Joerg Bischoff, Ilmenau (DE); Xinhui Niu, Los Altos, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 66 days.

(21) Appl. No.: 10/138,903

(22) Filed: May 2, 2002

(65) Prior Publication Data

US 2003/0206298 A1 Nov. 6, 2003

(51) Int. Cl.⁷ ............................. G01J 4/00; G01B 11/00
(52) U.S. Cl. ...................... 356/369; 356/400; 702/127; 430/22
(58) Field of Search ................................. 356/364–369, 356/399–401, 601, 614; 430/22, 30; 702/127; 382/144, 151; 250/548, 491.1

(56) References Cited

U.S. PATENT DOCUMENTS

| | | | |
|---|---|---|---|
| 4,332,473 A | | 6/1982 | Ono |
| 4,631,416 A | | 12/1986 | Trutna, Jr. |
| 4,929,083 A | | 5/1990 | Brunner |
| 5,347,356 A | | 9/1994 | Ota et al. |
| 5,452,090 A | | 9/1995 | Progler et al. |
| 5,468,580 A | | 11/1995 | Tanaka |
| 5,545,593 A | | 8/1996 | Watkins et al. |
| 5,559,598 A | * | 9/1996 | Matsumoto ................. 356/490 |
| 5,622,796 A | | 4/1997 | Canestrari et al. |
| 5,672,520 A | | 9/1997 | Natsume |
| 5,674,650 A | | 10/1997 | Dirksen et al. |
| 5,795,687 A | * | 8/1998 | Yasuda ......................... 430/22 |
| 6,079,256 A | | 6/2000 | Bareket |
| 6,383,888 B1 | | 5/2002 | Stirton |
| 6,457,169 B1 | * | 9/2002 | Ross ............................. 716/21 |
| 6,489,068 B1 | * | 12/2002 | Kye ............................. 430/22 |
| 2002/0158193 A1 | * | 10/2002 | Sezginer et al. ......... 250/237 G |
| 2003/0002043 A1 | * | 1/2003 | Abdulhalim et al. ....... 356/400 |
| 2003/0212525 A1 | * | 11/2003 | Bischoff et al. ............ 702/127 |

FOREIGN PATENT DOCUMENTS

| | | |
|---|---|---|
| DE | 19925831 A1 | 12/2000 |
| EP | 0 272 853 A2 | 6/1988 |
| EP | 0 281 030 A2 | 9/1988 |
| EP | 0 422 395 A2 | 4/1991 |
| EP | 0 634 702 A1 | 1/1995 |
| WO | 97/45773 | 12/1997 |
| WO | 02/25723 A2 | 3/2002 |

OTHER PUBLICATIONS

Neal T. Sullivan, Semiconductor Pattern Overlay, 15 pages, Digital Equipment Corp., Advanced Semiconductor Development, Hudson, MA 01749–2895.

Lifeng, Li "Symmetries of Cross–Polarization Diffraction Coefficients of Gratings," *J. Opt. Soc. Am. A*/vol. 17, No. 5 (2000).

Bischoff, J. et al., "Light Diffraction Based Overlay Measurement." *Proc. SPIE* vol. 4344, p. 22–233, *Metrology, Inspection, and Process Control for Microlithography XV*, (2001).

\* cited by examiner

*Primary Examiner*—Hoa Q. Pham
(74) *Attorney, Agent, or Firm*—Morrison & Foerster LLP

(57) ABSTRACT

Overlay measurements for a semiconductor wafer are obtained by forming a periodic grating on the wafer having a first set of ridges and a second set of ridges. The first and second sets of ridges are formed on the wafer using a first mask and a second mask, respectively. After forming the first and second sets of gratings, zero-order cross polarization measurements of a portion of the periodic grating are obtained. Any overlay error between the first and second masks used to form the first and second sets of gratings is determined based on the obtained zero-order cross polarization measurements.

116 Claims, 21 Drawing Sheets

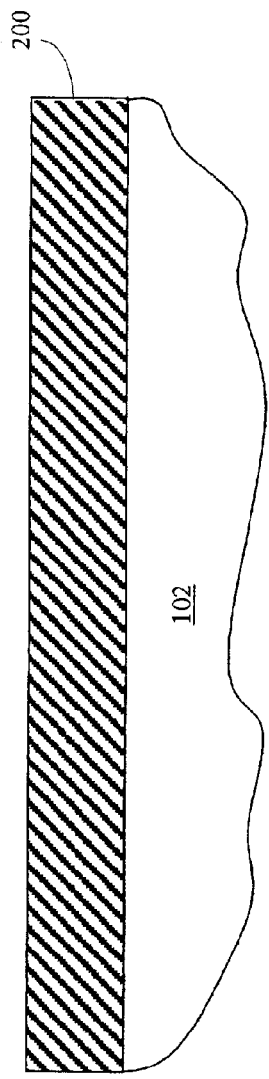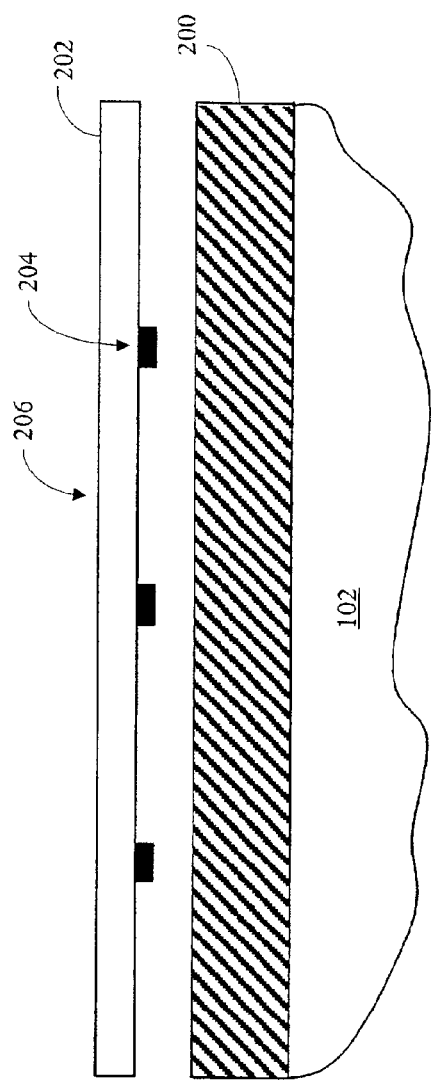

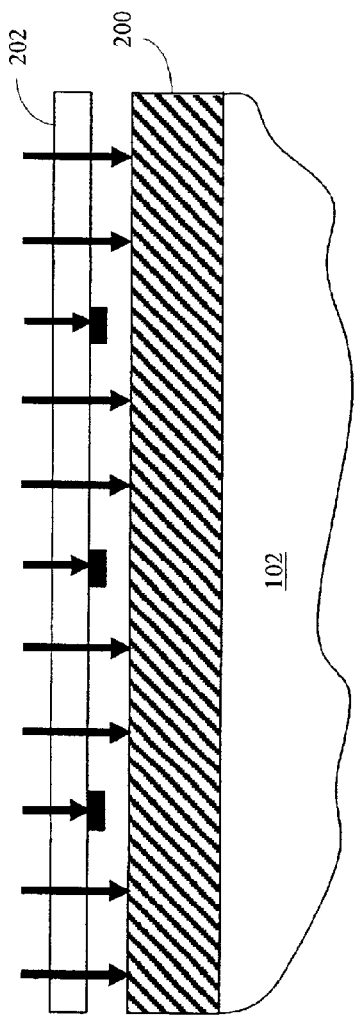
Fig. 2-C
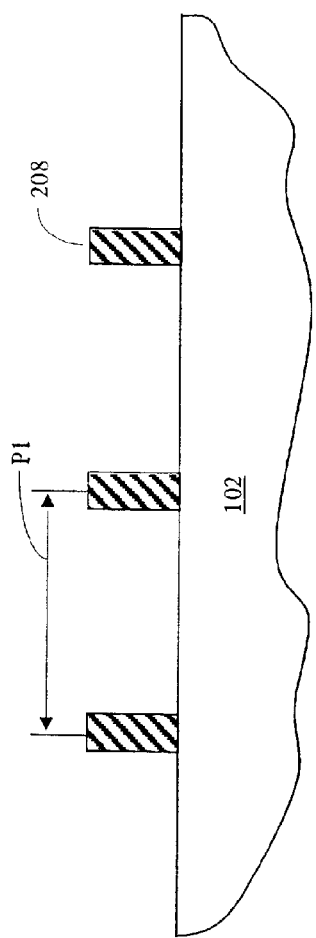
Fig. 2-D

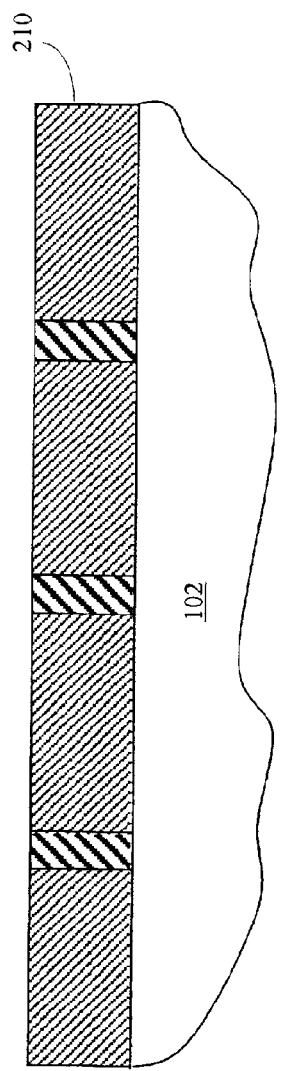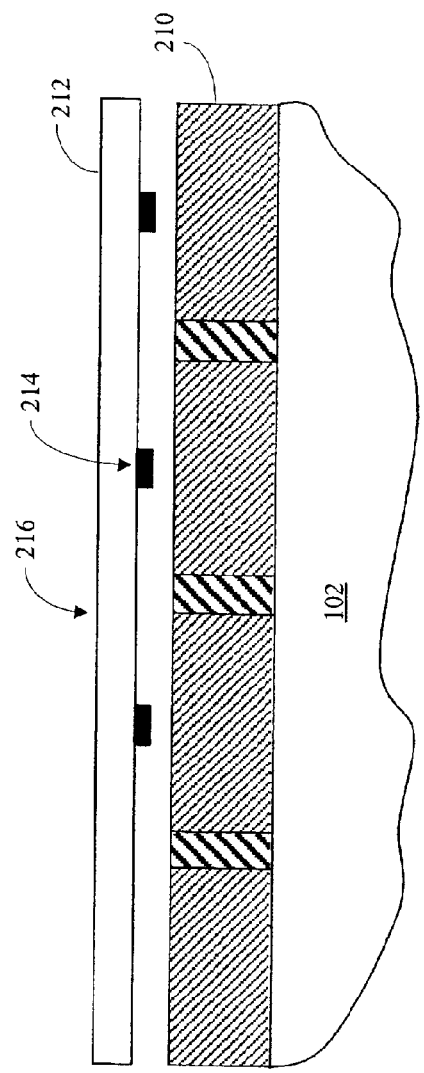

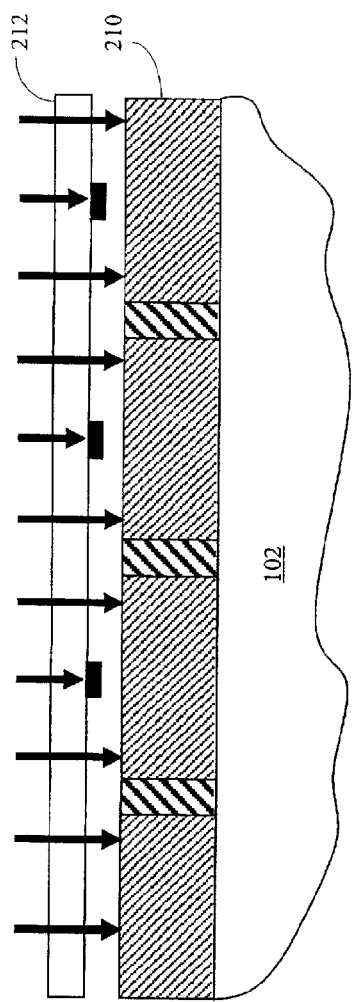
*Fig. 2-G*
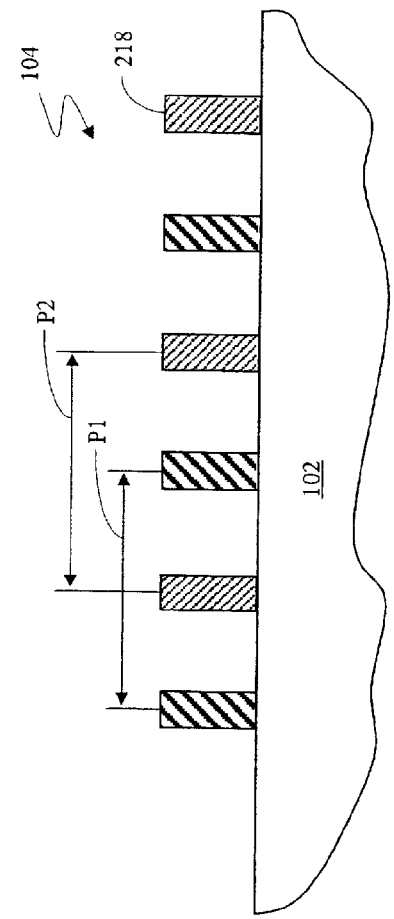
*Fig. 2-H*

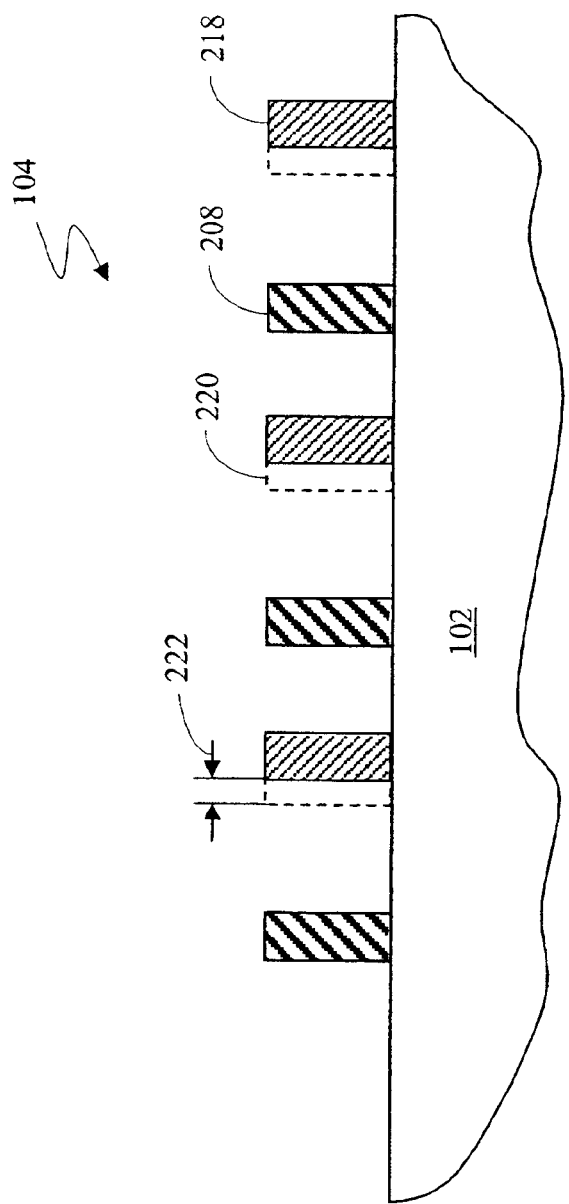
Fig. 2-I

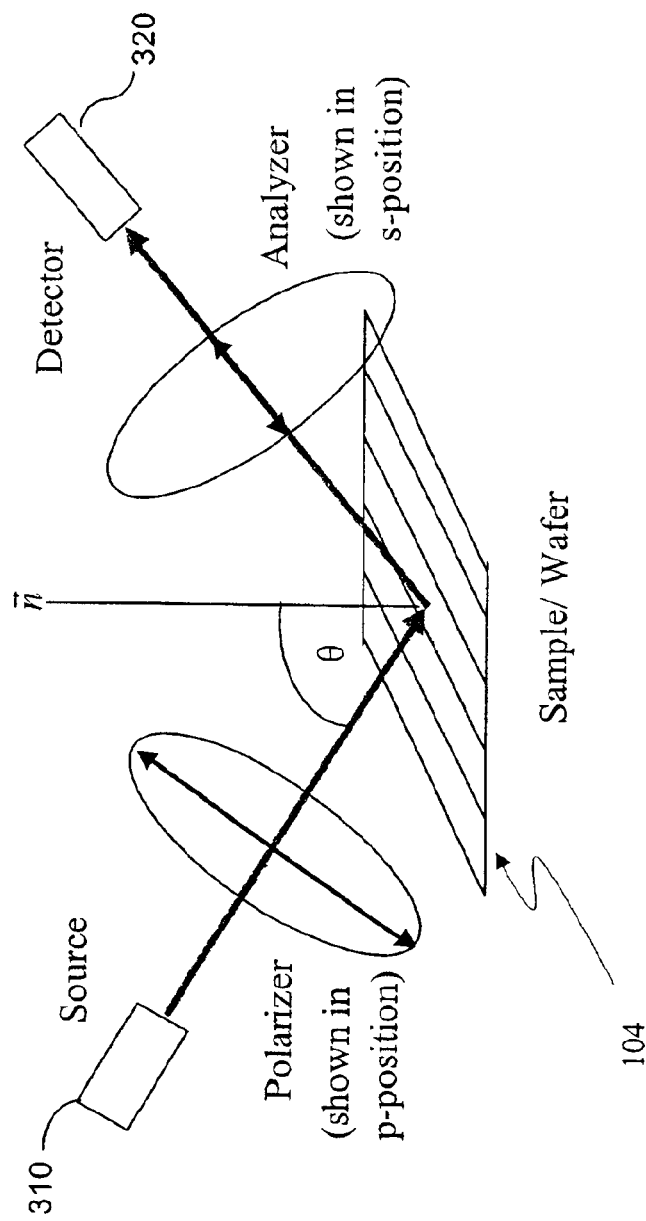
Fig. 4-A

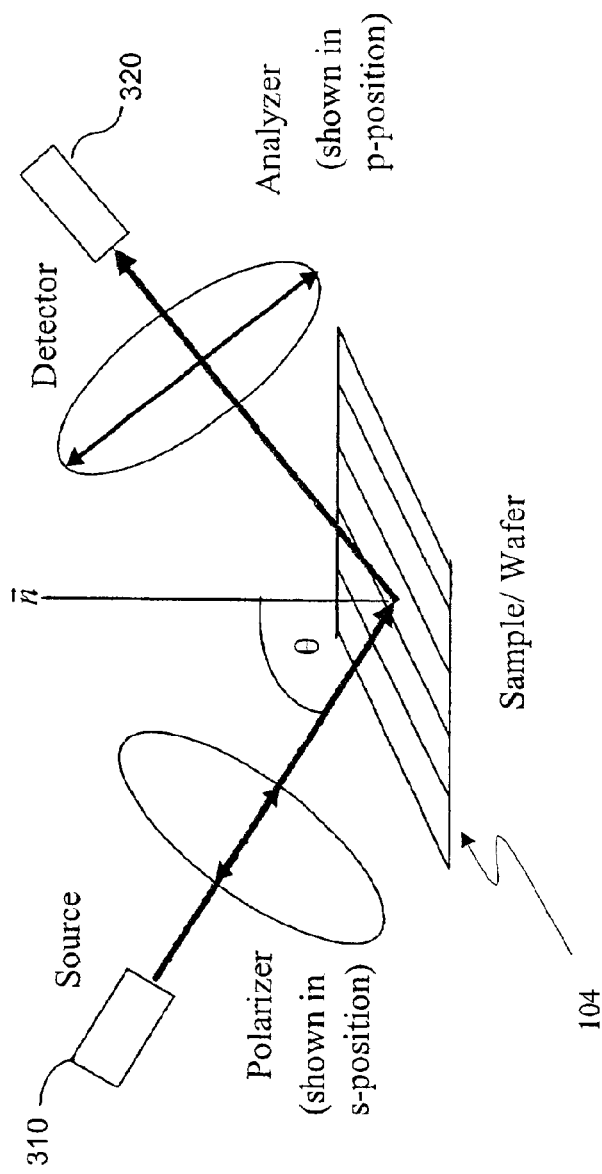
Fig. 4-B

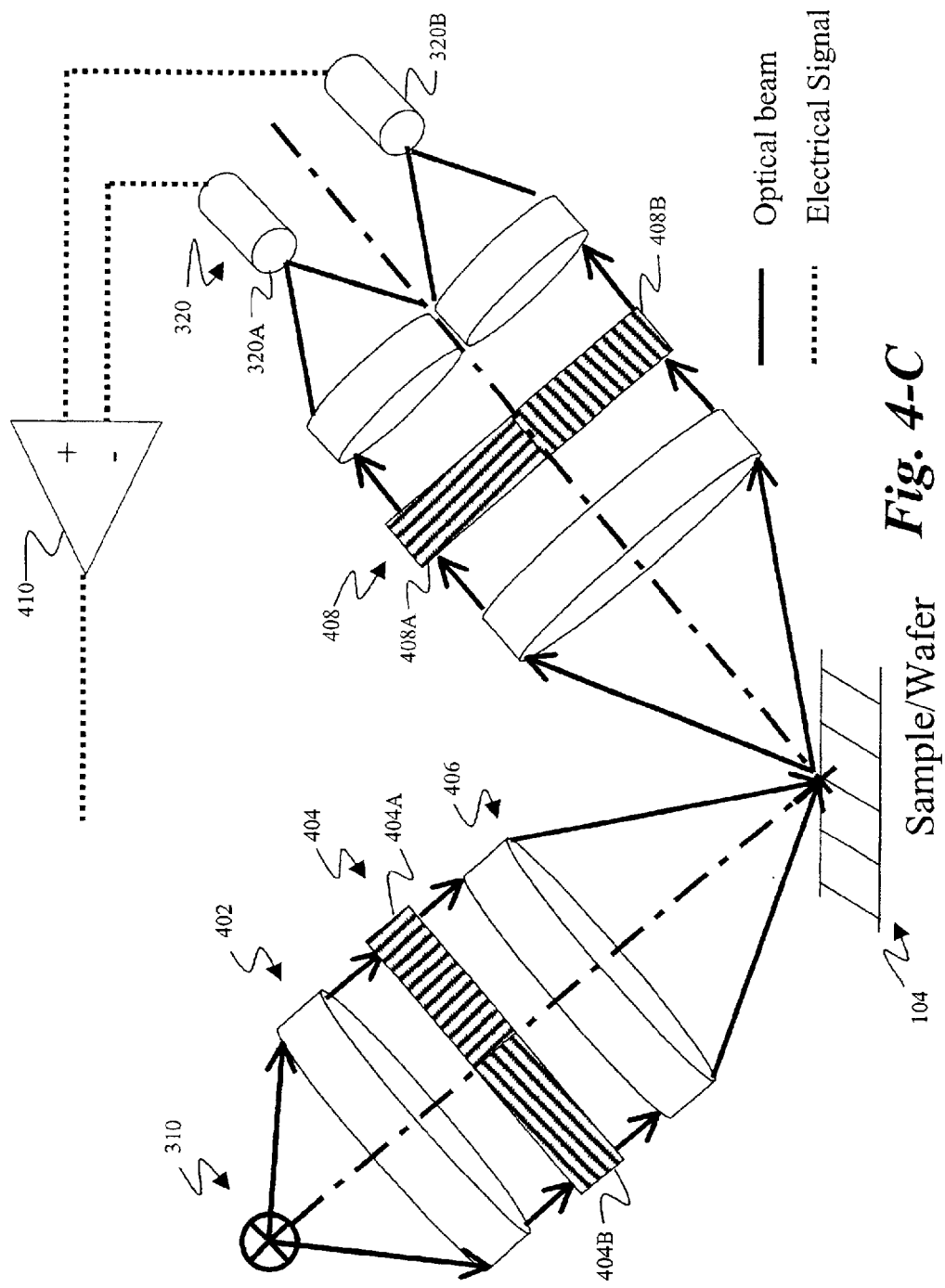
*Fig. 4-C*

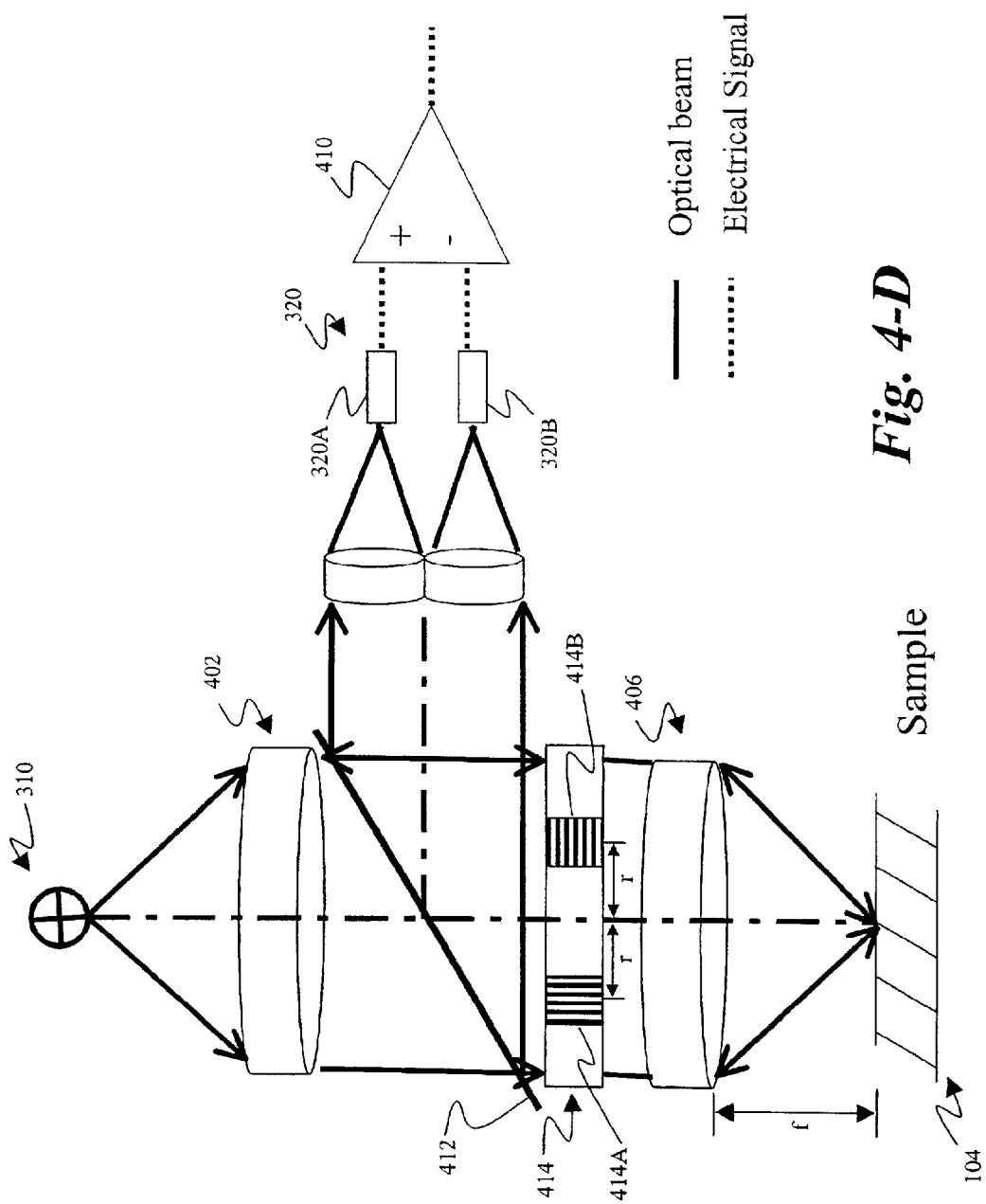
Fig. 4-D

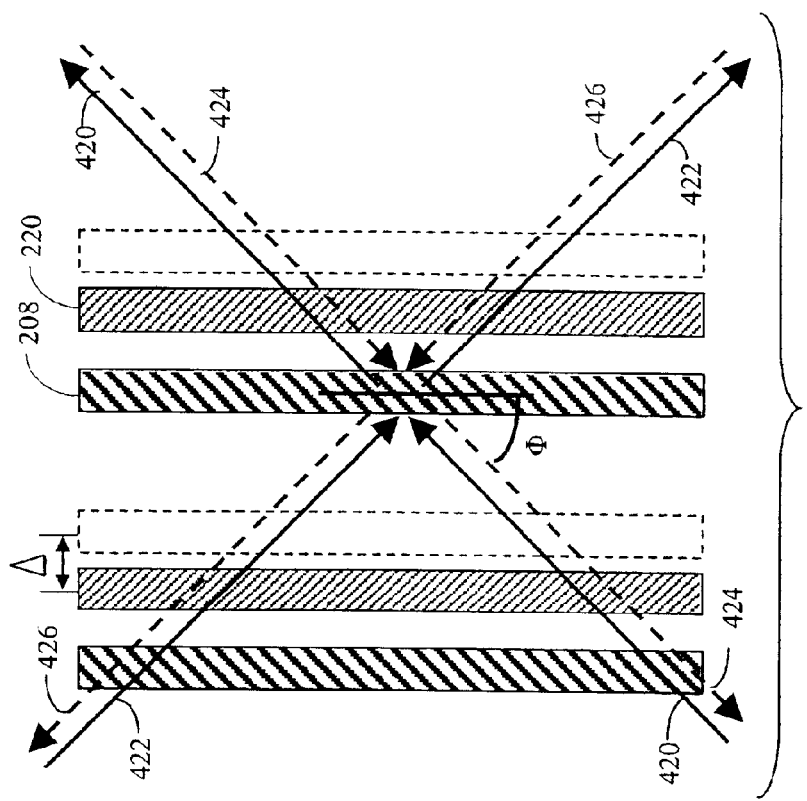
*Fig. 4-F*
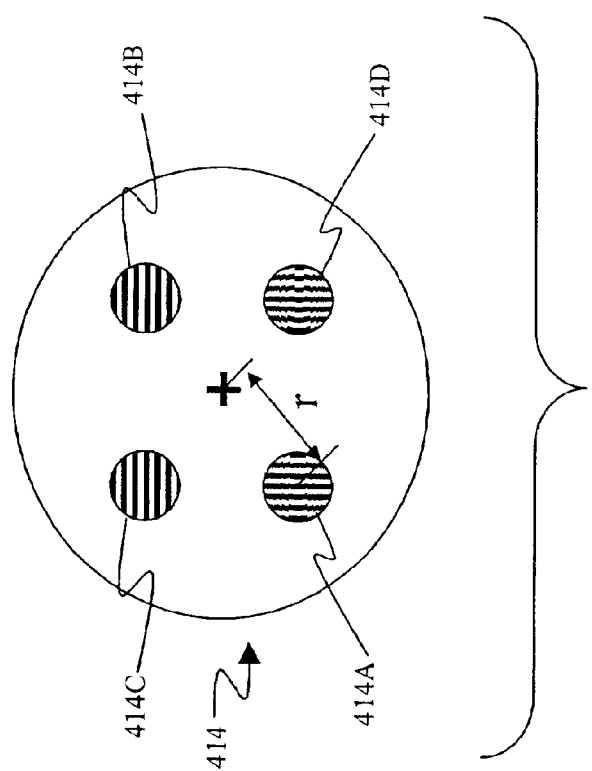
*Fig. 4-E*

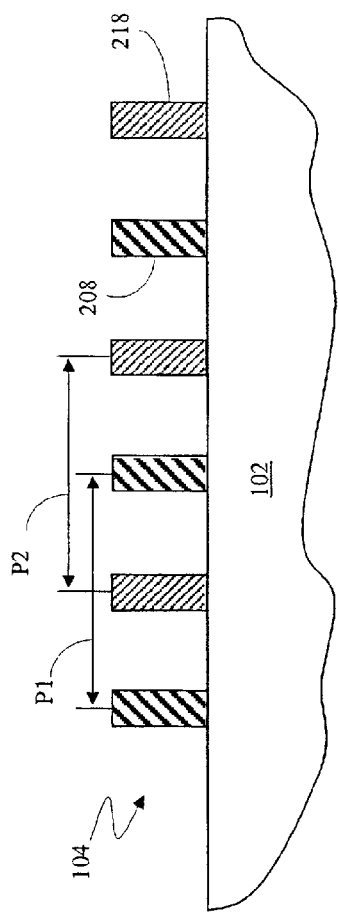
*Fig. 5-A*
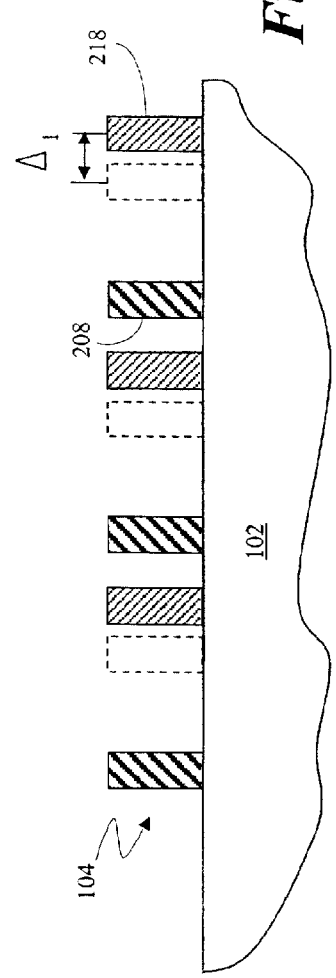
*Fig. 5-B*
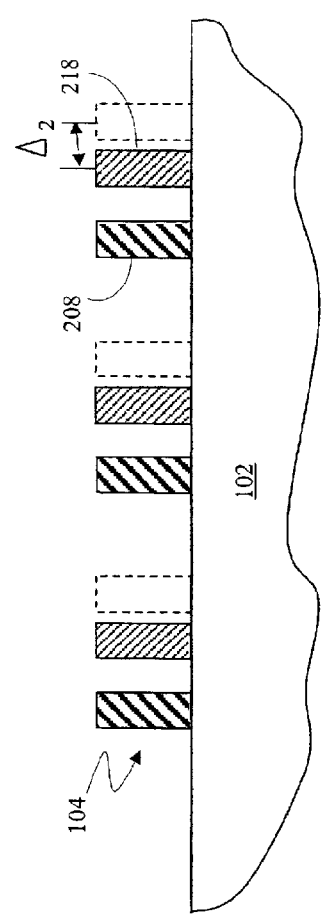
*Fig. 5-C*

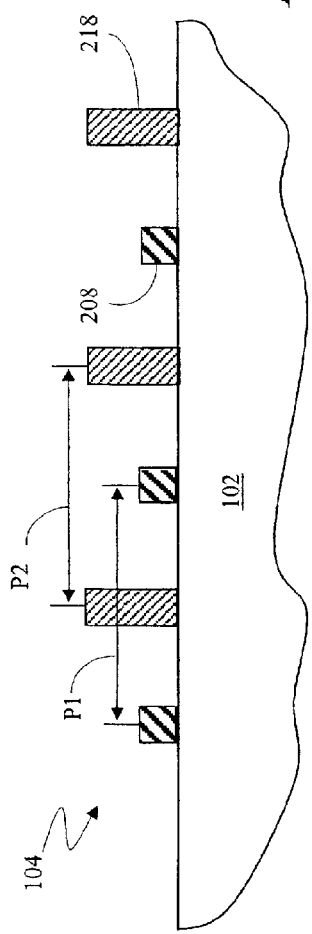
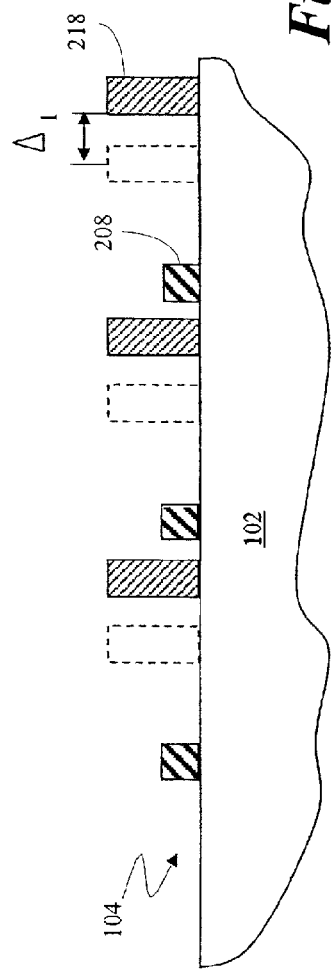
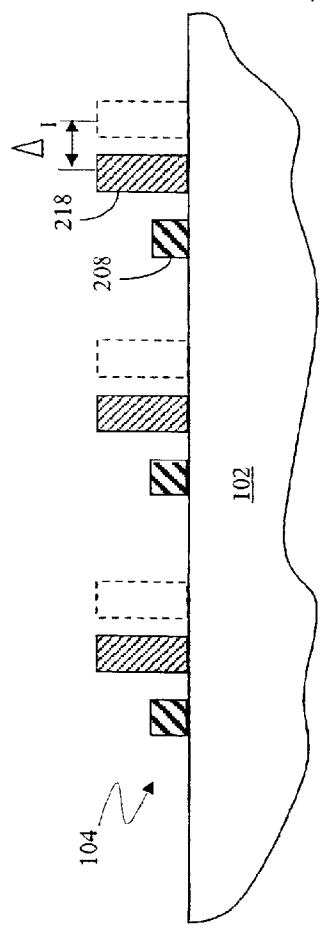
Fig. 8-A
Fig. 8-B
Fig. 8-C

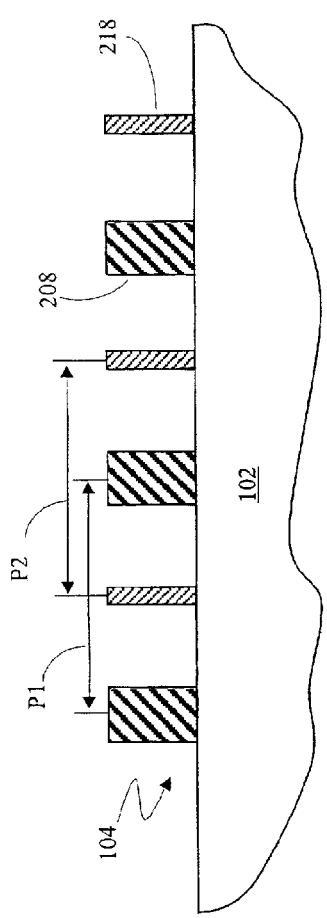
Fig. 11-A
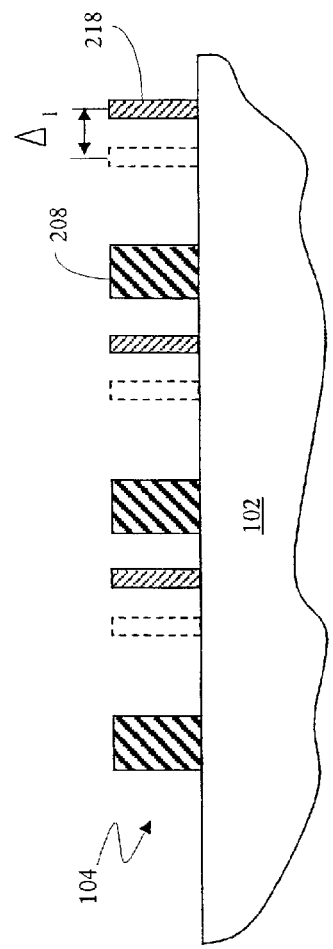
Fig. 11-B
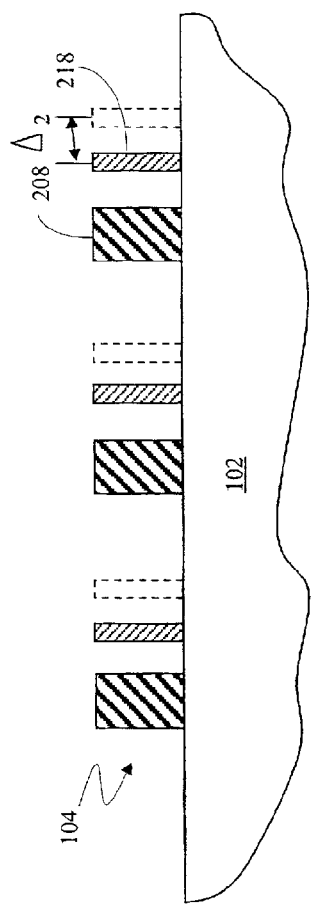
Fig. 11-C

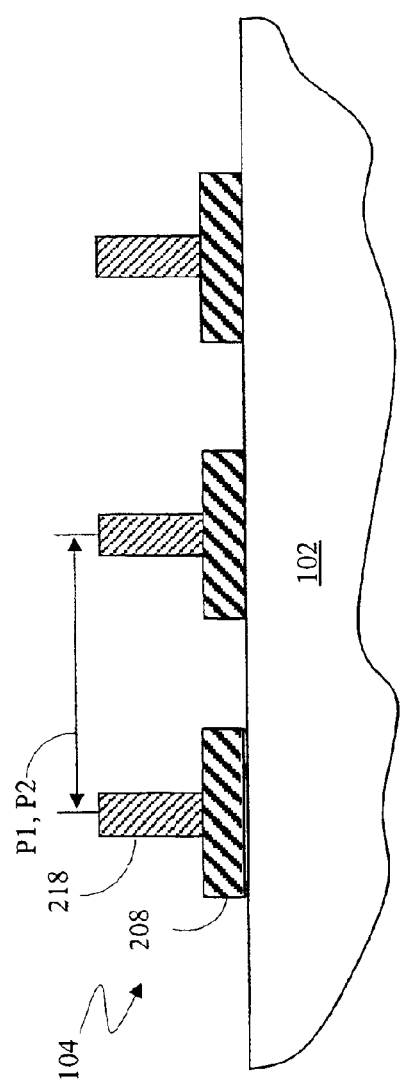
Fig. 14-A

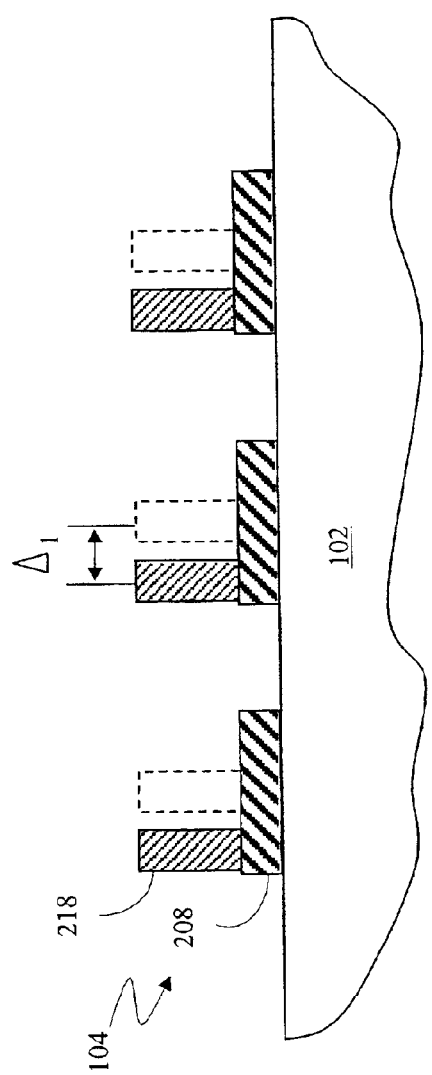
Fig. 14-B
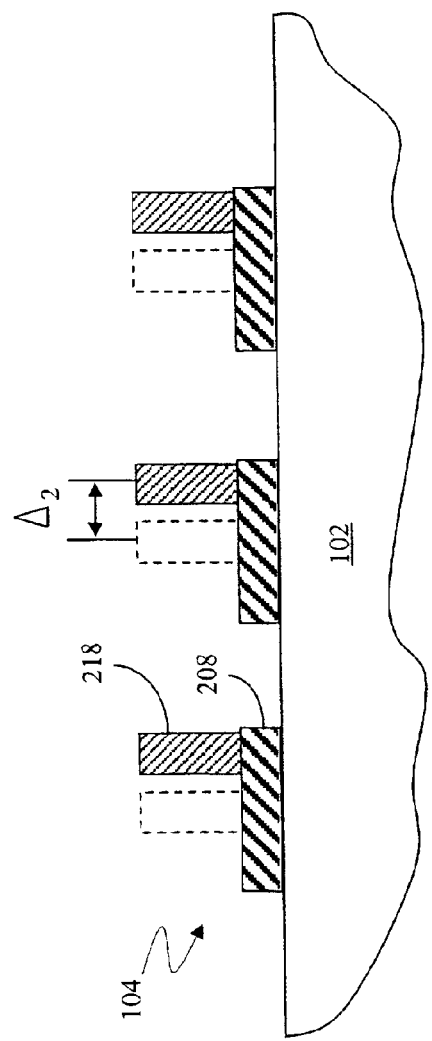
Fig. 14-C

OVERLAY MEASUREMENTS USING ZERO-ORDER CROSS POLARIZATION MEASUREMENTS

BACKGROUND

1. Field of the Invention

The present invention relates to wafer metrology, and more particularly to obtaining overlay measurements for a semiconductor wafer using zero-order cross polarization measurements obtained from a periodic grating formed on the wafer.

2. Related Art

Semiconductor devices/circuits are formed on semiconductor wafers by depositing and patterning layers of materials. In general, the features of the devices/circuits are formed onto the layers of deposited materials using a patterning process.

In a typical patterning process, the features of the devices/circuits are laid out, one layer at a time, on a series of photomasks (masks). The layout of the features of the devices/circuits on the masks are transferred, one mask at a time, onto the deposited layers of materials. Misalignment of these masks, which is generally referred to as "overlay error", can adversely affect the performance of the devices/circuits.

To reduce overlay error, alignment marks, such as box-in-box or frame-in-frame overlay marks, are typically patterned onto the wafer and on layers deposited onto the wafer. At present, optical imaging systems are widely used to detect these alignment marks. However, a conventional optical imaging system typically has an accuracy of only about 5 to 10 nm. The continual shrinkage in the feature sizes of devices/circuits will likely require greater accuracy.

SUMMARY

In an exemplary embodiment, overlay measurements for a semiconductor wafer are obtained by forming a periodic grating on the wafer having a first set of ridges and a second set of ridges. The first and second sets of ridges are formed on the wafer using a first mask and a second mask, respectively. After forming the first and second sets of gratings, zero-order cross polarization measurements of a portion of the periodic grating are obtained. Any overlay error between the first and second masks used to form the first and second sets of gratings is determined based on the obtained zero-order cross polarization measurements.

DESCRIPTION OF DRAWING FIGURES

The present invention can be best understood by reference to the following description taken in conjunction with the accompanying drawing figures, in which like parts may be referred to by like numerals:

FIG. 1 depicts an exemplary semiconductor wafer;

FIGS. 2-A to 2-I depict an exemplary process of forming a periodic grating;

FIG. 3 depicts an exemplary optical metrology system;

FIGS. 4-A, 4-B, 4-C, 4-D, and 4-E depict portions of various exemplary optical metrology systems;

FIG. 4-F is a top view of a portion of a periodic grating;

FIGS. 5-A to 5-C depict a portion of an exemplary periodic grating;

Figure 9:
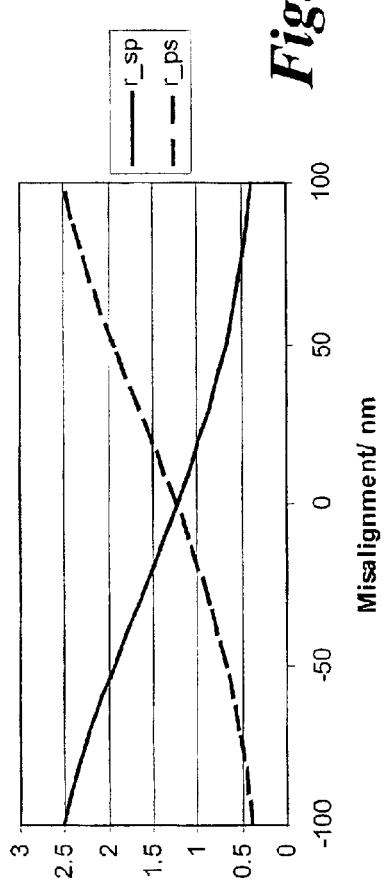
Figure 10:
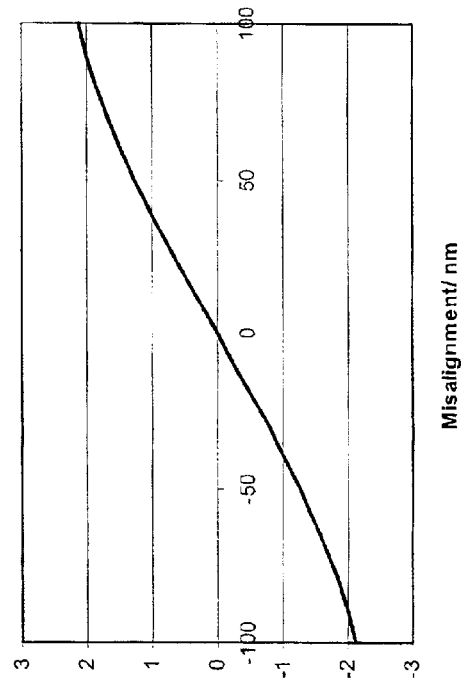
Figure 12:
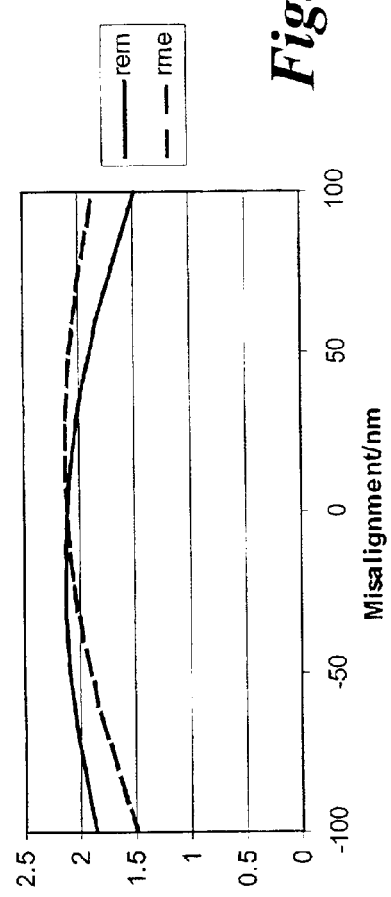
Figure 13:
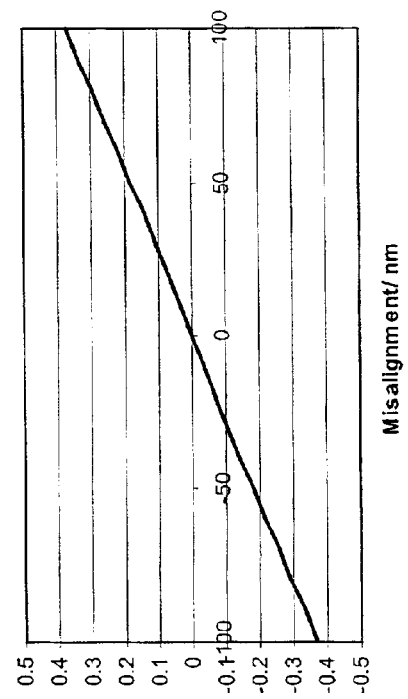
Figure 15:
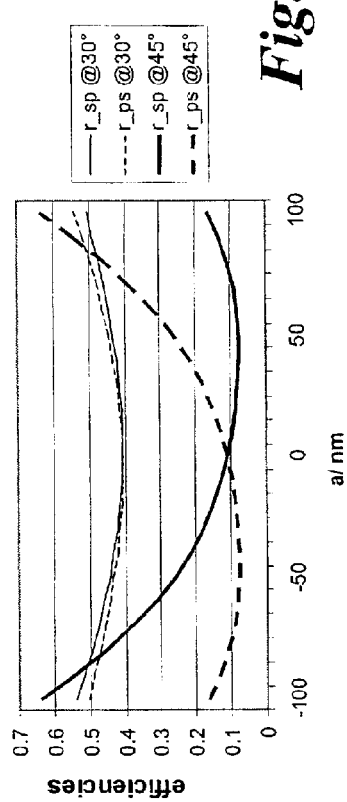

FIGS. 8-A to 8-C depict a portion of an exemplary periodic grating;

FIG. 9 depicts exemplary response curve;

FIG. 10 depicts an exemplary calibration curve;

FIGS. 11-A to 11-C depict a portion of an exemplary periodic grating;

FIG. 12 depicts exemplary response curve;

FIG. 13 depicts an exemplary calibration curve;

FIGS. 14-A to 14-C depict a portion of an exemplary periodic grating;

FIG. 15 depicts exemplary response curve; and

Figure 16:
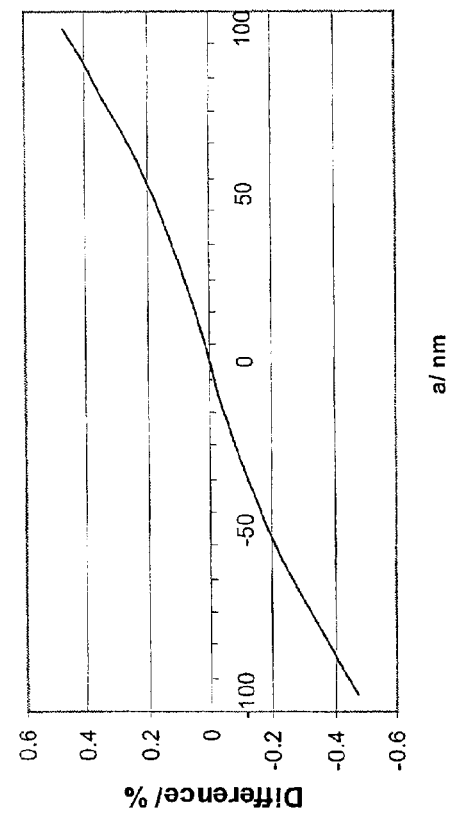

FIG. 16 depicts an exemplary calibration curve.

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

Figure 1:
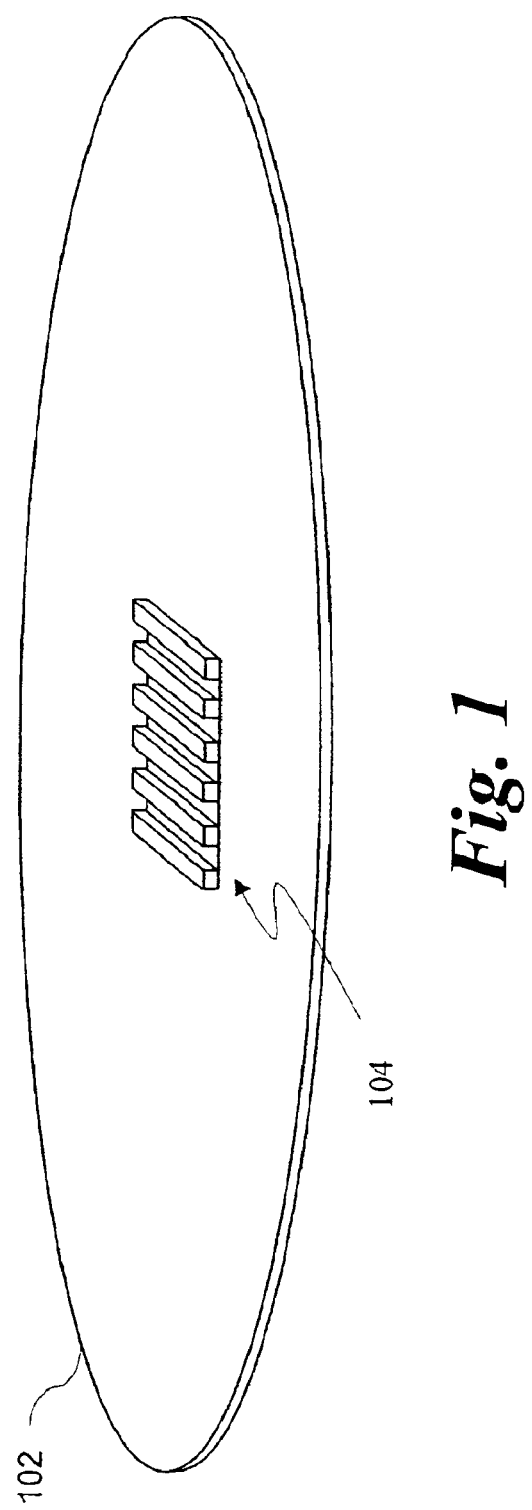

With reference to FIG. 1, as discussed earlier, the process of fabricating semiconductor devices/circuits on wafer 102 includes depositing and patterning layers of materials on wafer 102. More particularly, the features of the semiconductor devices/circuits are formed one layer at a time by depositing a layer of material, then removing portions of the deposited layer of material.

The process of depositing the layers of material is generally referred to as a deposition process. Exemplary deposition processes include chemical vapor deposition (CVD), oxidation, spin coating, sputtering, and the like. Exemplary materials that are deposited include oxides, metals, and the like.

The process of forming features on the deposited layers of materials is generally referred to as a patterning process, which typically includes a photolithography process and an etching process. More particularly, in a typical lithographic process, the features of the semiconductor device/circuit is laid out one layer at a time on a series of photomasks (masks). A single mask typically includes the layout for one layer of one or more chips throughout wafer 102.

As described above, multiple layers are typically deposited and patterned to form the features of semiconductor devices/circuits. As such, in forming these multiple layers, each mask, which corresponds to each layer, is aligned to properly form the features of the devices/circuits. Misalignment of the mask is typically referred to as an "overlay error." As noted earlier, overlay error can adversely affect the performance of the devices/circuits.

As will be described in greater detail below, an overlay measurement, which is a measure of overlay error, can be obtained using a periodic grating 104 formed on wafer 102. More particularly, as the features of the devices/circuits are formed on wafer 102 through the fabrication process described above, the features of periodic grating 104 are also formed on wafer 102. Thus, periodic grating 104 can be examined to obtain overlay measurements for wafer 102.

More particularly, one or more periodic gratings 104 can be formed in test areas on wafer 102 that are proximate to or within devices/circuits formed on wafer 102. For example, periodic grating 104 can be formed adjacent a device/circuit formed on wafer 102. Alternatively, periodic grating 104 can be formed in an area of the device/circuit that does not interfere with the operation of the device/circuit. Thus, the overlay measurements obtained for periodic grating 104 can be used to determine whether the devices/circuits adjacent periodic grating 104 have been fabricated according to specifications.

With reference now to FIGS. 2-A through 2-H, an exemplary fabrication process is depicted for forming periodic grating 104 (FIG. 1) on wafer 102. As noted above, the fabrication process that forms periodic grating 104 (FIG. 1) can also form devices/circuits of one or more chips throughout wafer 102. It should be noted that the following description is intended to be illustrative rather than comprehensive. As such, periodic grating 104 (FIG. 1) can be formed on wafer 102 with fewer or more process steps.

With reference to FIG. 2-A, a first layer 200 is deposited on wafer 102. For the purpose of this example, assume that first layer 200 is a photoresist layer. However, as noted earlier, first layer 200 can include various materials, such as oxides, metals, and the like.

With reference to FIG. 2-B, a first mask 202 is positioned above wafer 102 and first layer 200. First mask 202 includes portions 204 that block light and portions 206 that transmit light. Portions 204 of first mask 202 that block light can be patterned to have the same shape as the features that are to be formed on first layer 200. These types of masks are generally referred to as "light field" masks. Alternatively, portions 206 of first mask 202 that transmit light can be patterned to have the same shape as the features that are to be formed on first layer 200. These types of masks are generally referred to as "dark field" masks. For the sake of convenience and clarity, first mask 202 is depicted and described as being a "light field" mask.

With reference to FIG. 2-C, first mask 202 is aligned relative to wafer 102 such that the features that are to be formed on first layer 200 are positioned in the proper intended location. When first mask 202 is properly aligned, first mask 202 and portions of first layer 200 are exposed to light. As depicted in FIG. 2-C, only certain portions of first layer 200 are exposed to the light, i.e., the portions under portions 206 (FIG. 2-B) of first mask 202 that transmit light.

As described above, in this example, first layer 200 is a photoresist layer, which has the material characteristic that its solubility is responsive to exposure to light. More particularly, some photoresist change from a soluble to an insoluble condition when exposed to light. These types of photoresist are generally known as "negatively acting" resist. In contrast, some photoresist change from an insoluble to a soluble condition when exposed to light. These types of photoresist are generally known as "positively acting" resist. For the sake of convenience and clarity, assume that first layer 200 is a "positively acting" resist.

As such, with reference now to FIG. 2-D, when first layer 200 is exposed to an appropriate chemical solvent (i.e., a developer), the portions of first layer 200 that were exposed to the light are dissolved. Thus, in the present example, the remaining portions of first layer 200 form ridges 208 of periodic grating 104 (FIG. 1). As depicted in FIG. 2-D, ridges 208 are spaced regularly with a period of P1.

It should be noted that first mask 202 (FIG. 2-B) can be patterned to include the shapes of the features of one layer of the devices/circuits that are to be formed on wafer 102 (FIG. 1), and more particularly on first layer 200. As such, during the process of forming ridges 208 of periodic grating 104 (FIG. 1), the features of one layer of devices/circuits are also being formed on first layer 200 of one or more chips throughout wafer 102.

With reference now to FIG. 2-E, assume now that a second layer 210 is deposited. For the purpose of this example, assume that second layer 210 is also a photoresist layer. However, as noted earlier, second layer 210 can include various materials, such as oxides, metals, and the like. Additionally, it should be noted that FIG. 2-E, similar to all the figures, is intended to be illustrative rather than realistic. For example, although in FIG. 2-E the topology of second layer 210 is depicted as being flat, it is typically uneven.

With reference now to FIG. 2-F, a second mask 212 is positioned above wafer 102 and second layer 210. Similar to first mask 202 (FIG. 2-A), assume for the sake of this example that second mask 212 is also a "light field" mask. As such, portions 214 of second mask 212 that block light are patterned to have the same shape as the features that are to be formed on second layer 210. However, similar to first mask 202 (FIG. 2-A), portions 216 of second mask 212 that transmit light can be patterned to have the same shape as the features that are to be formed on second layer 210.

With reference to FIG. 2-G, second mask 212 is aligned relative to wafer 102 such that the features that are to be formed on layer 210 are positioned in the proper location. When second mask 212 is properly aligned, second mask 212 and portions of layer 210 are exposed to light. As depicted in FIG. 2-G, only certain portions of layer 210 are exposed to the light, i.e., the portions under portions 216 (FIG. 2-F) of second mask 212 that transmit light.

Similar to first layer 200 (FIG. 2-A), assume for the sake of this example that second layer 210 is formed from a "positively acting" resist. As such, with reference now to FIG. 2-G, when second layer 210 is exposed to an appropriate chemical solvent (i.e., a developer), the portions of second layer 210 that were exposed to the light are dissolved. Thus, in the present example, the remaining portions of second layer 210 form ridges 218 of periodic grating 104 (FIG. 1). As depicted in FIG. 2-H, ridges 218 are spaced regularly with a period of P2.

It should be noted that second mask 212 (FIG. 2-F) can be patterned to include the shapes of the features of another layer of the devices/circuits that are to be formed on wafer 102 (FIG. 1), and more particularly on second layer 210. As such, during the process of forming ridges 218 of periodic grating 104 (FIG. 1), the features of another layer of devices/circuits are also being formed on second layer 210 of one or more chips throughout wafer 102.

As noted earlier, misalignment of first mask 202 (FIG. 2-B) and/or second mask 212 (FIG. 2-F) can produce "overlay error." For example, with reference now to FIG. 2-I, assume that due to a misalignment of second mask 212 (FIG. 2-F) with respect to first mask 202 (FIG. 2-B), the location of ridges 218 is shifted from its proper intended location. In FIG. 2-I, assume that dotted outlines 220 depict the proper intended location of ridges 218. As such, offset 222 indicates the amount by which ridges 218 have been shifted from their intended position. Thus, offset 222 represents the "overlay error" that has occurred.

As noted above, as ridges 208 and 218 of periodic grating 104 (FIG. 1) are formed using first mask 202 (FIG. 2-B) and second mask 212 (FIG. 2-F), the features of two layers of devices/circuits are also being formed on one or more chips throughout wafer 102 (FIG. 1). As such, a misalignment of second mask 212 (FIG. 2-F) produces a shift in the location of the features of the second layer of the devices/circuits formed on second layer 210 (FIG. 2-E) relative to the features of the first layer of the devices/circuits formed on first layer 200 (FIG. 2-A).

Although ridges 208 and 218 have been depicted and described as being formed directly on wafer 102, it should be noted that ridges 208 and 218 can be formed on an intermediate layer formed on wafer 102.

As also noted above, periodic grating 104 (FIG. 1) is formed adjacent devices/circuits formed on wafer 102 (FIG. 1). As such, overlay measurements (i.e., the measurement of the overlay error) of periodic grating 104 (FIG. 1) can be used to determine whether an overlay error exists in the devices/circuits adjacent periodic grating 104 (FIG. 1).

Furthermore, as noted above, a single mask typically includes the layout of one layer of one more chips on wafer 102 (FIG. 1). For example, first mask 202 (FIG. 2-B) includes the layout for first layer 200 (FIG. 2-B) of one or more chips on wafer 102 (FIG. 1). Second mask 212 (FIG. 2-F) includes the layout for second layer 210 (FIG. 2-F) of one or more chips on wafer 102 (FIG. 1). As such, overlay measurements of periodic grating 104 (FIG. 1) can be used to determine whether an overly error exists in the devices/circuits of one or more chips throughout wafer 102 (FIG. 1).

Figure 3:
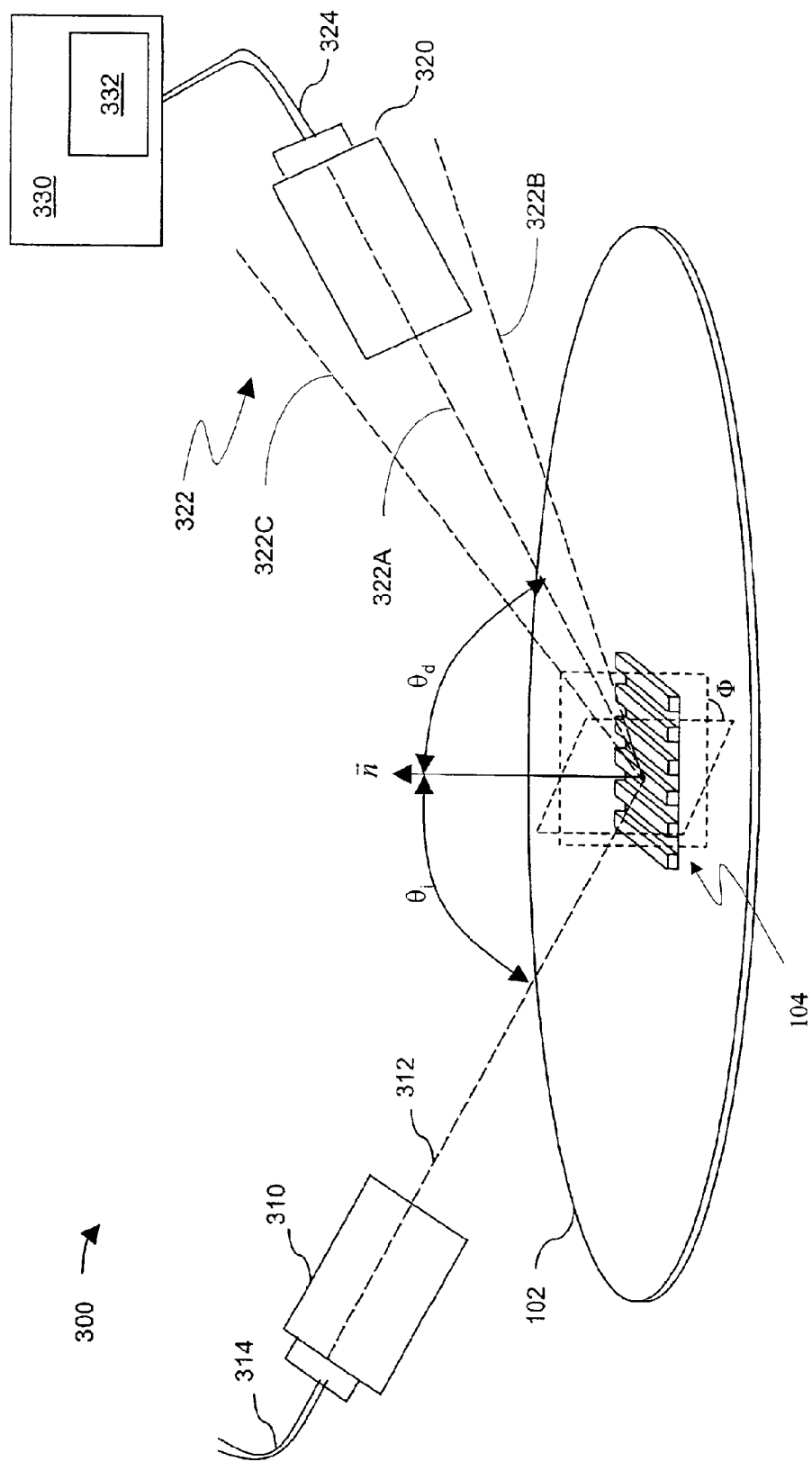

With reference now to FIG. 3, an optical metrology system 300 can be configured to examine periodic grating 104 to obtain overlay measurements. More particularly, as depicted in FIG. 3, optical metrology system 300 includes an electromagnetic source 310. Periodic grating 104 is illuminated by an incident signal 312 from electromagnetic source 310. Electromagnetic source 310 can include focusing optics to control the spot size of incident signal 312. In one embodiment, the spot size of incident signal 312 can be reduced to less than the size of the test area on wafer 102 that contains periodic grating 104. For example, a spot size of about 50 $\mu$m by 50 $\mu$m, or smaller, can be used. Additionally, electromagnetic source 310 can include a pattern recognition module to center the spot in the test area on wafer 102. Furthermore, as depicted in FIGS. 4-A and 4-B, electromagnetic source 310 can include a polarizing element such as a polarizer.

As depicted in FIG. 3, incident signal 312 is directed onto periodic grating 104 at an incidence angle $\theta_i$ with respect to normal $\vec{n}$ of periodic grating 104, and an azimuthal angle $\Phi$ (i.e., the angle between the plane of incidence signal 312 and the direction of the periodicity of periodic grating 104).

As depicted in FIG. 3, diffraction signal 322 leaves at an angle of $\theta_d$ with respect to normal $\vec{n}$. More particularly, diffraction signal 322 includes a plurality of diffraction orders. For the sake of illustration and clarity, FIG. 3 depicts diffraction signal 322 having a zero-order diffraction (diffraction signal 322A), a positive first-order diffraction (diffraction signal 322B), and a negative first-order diffraction (diffraction signal 322C). It should be recognized, however, that diffraction signal 322 can include any number of diffraction orders.

Diffraction signal 322 is received by detector 320 and analyzed by signal-processing system 330. When optical metrology system 300 includes an ellipsometer, the amplitude ratio tan $\Psi$ and the phase $\Delta$ of diffraction signal 322 is received and detected. When optical metrology system 300 includes a reflectometer, the relative intensity of diffraction signal 322 is received and detected. Additionally, as depicted in FIGS. 4-A and 4-B, detector 320 can include a polarizing element such as an analyzer.

In one exemplary embodiment, periodic grating 104 is illuminated obliquely and conically, meaning that incidence angle $\theta_i$ is not equal to zero degrees and the azimuthal angle $\Phi$ is not equal to zero degrees. Zero-order cross polarization measurements are obtained, and then overlay measurements are obtained based on the zero-order cross polarization measurements.

For example, with reference now to FIG. 5-A, ridges 208 and 218 of periodic grating 104 are depicted having periods of P1 and P2, respectively. In the present example, assume that periods P1 and P2 are the same.

Ridges 208 are formed using a first mask, and ridges 218 are formed using a second mask. Additionally, as depicted in FIG. 5-A, when the first and second masks are properly aligned, ridges 208 and 218 are formed symmetrically aligned such that the spacing between a ridge 218 and a ridge 208 on either side is equal. More particularly, ridges 208 and 218 are symmetrically aligned when the spacing between their centerlines is uniform. However, if an overlay error exists, ridges 208 and 218 are formed asymmetrically aligned such that the spacing between a ridge 218 and a ridge 208 on either side is uneven. For example, in FIG. 5-B, ridges 218 are depicted as being formed with an offset of $\Delta_1$ from their symmetrically aligned position. In FIG. 5-C, ridges 218 are depicted as being formed with an offset of $\Delta_2$ from their symmetrically aligned position.

As described above, in the present exemplary embodiment, grating 104 is illuminated obliquely and conically to obtain zero-order cross polarization measurements. For example, with reference to FIG. 4-A, when using an ellipsometer, the polarizer and analyzer of the ellipsometer can be set to a first angular setting, such as 90 degrees/0 degrees, to obtain a first zero-order cross polarization measurement. With reference to FIG. 4-B, the polarizer and analyzer of the ellipsometer can then be set to a second angular that is rotated 90 degrees from the first angular setting, such as 0 degrees/90 degrees, to obtain a second zero-order cross polarization measurement.

Additionally, with reference to FIG. 4-C, a split-pupil lens can be used to obtain zero-order cross polarization measurements without having to switch the angular settings of the polarizer and analyzer. More particularly, as depicted in FIG. 4-C, a polarizer 404 with a split pupil having an s-polarizing portion 404A and a p-polarizing portion 404B can be disposed between a collimator 402 and a focusing lens 406. An analyzer 408 with a split pupil having a p-polarizing portion 408A and an s-polarizing portion 408B can be used to provide s-p and p-s polarization to detector 320. More particularly, p-polarizing portion 408A provides s-p polarization to an s-p polarization detector 320A, and s-polarizing portion 408B provides p-s polarization to a p-s polarization detector 320B.

As such, an s-p polarization measurement and a p-s polarization measurement can be obtained concurrently. More particularly, in the configuration depicted in FIG. 4-C, the two polarization measurements can be obtained from a differential amplifier 410 connected to s-p polarization detector 320A and p-s polarization detector 320B. It should be noted that the optical and electrical components depicted in FIG. 4-C are exemplary and that one or more components can be omitted or added depending on the application.

For example, FIG. 4-D depicts the use of a single polarizer 414 with a beam splitter 412. More specifically, as depicted in FIG. 4-E, polarizer 414 can include a plurality of polarizing elements (i.e., s-polarizing elements 414A and 414D, and p-polarizing elements 414B and 414C) that are disposed at an equal distance r from the optical axis. Thus, as depicted in FIG. 4-F, an s-p polarization measurement 420 can be obtained using s-polarizing element 414A (FIG. 4-E) and p-polarizing element 414B (FIG. 4-E). A p-s polarization measurement 422 can be obtained using p-polarizing element 414C (FIG. 4-E) and s-polarizing element 414D (FIG. 4-E). Moreover, s-p polarization measurement 420 and p-s polarization measurement 422 can be obtained concurrently.

With reference to FIG. 4-D, the incidence angle can be determined based on the distance r from the optical axis and the focal length f of focusing lens 406 (i.e., tan(Θ))=r/f). In the configuration depicted in FIG. 4-F, s-p polarization measurement 420 is obtained with an azimuthal angle Φ of 45 degrees, and p-s polarization measurement 422 is obtained with an azimuthal angle Φ of 135 degrees. Additionally, a p-s polarization measurement 424 can be obtained using p-polarizing element 414B (FIG. 4-E) and s-polarizing element 414A (FIG. 4-E), which would be obtained with an azimuthal angle Φ of 225 degrees. An s-p polarization measurement 426 can be obtained using s-polarizing element 414D (FIG. 4-E) and p-polarizing element 414C (FIG. 4-E), which would be obtained with an azimuthal angle Φ of 315 degrees.

Assume that ridges 220 are formed with an offset of Δ from their symmetrically aligned positions, which are depicted in dashed lines. As described above, with reference to FIG. 4-E, a first s-p polarization measurement 420 (FIG. 4-F) can be obtained using s-polarizing element 414A and p-polarizing element 414B (i.e., $S_{1(s\text{-}p)}$). A first p-s polarization measurement 422 (FIG. 4-F) can be obtained using p-polarizing element 414C and s-polarizing element 414D (i.e., $S_{1(p\text{-}s)}$). A second p-s polarization measurement 424 (FIG. 4-F) can be obtained using p-polarizing element 414B and s-polarizing element 414A (i.e., $S_{2(s\text{-}p)}$). A second s-p polarization measurement 426 (FIG. 4-F) can be obtained using s-polarizing element 414D and p-polarizing element 414C (i.e., $S_2(p\text{-}s)$). Note that in the configuration depicted in FIG. 4-F, the misalignment of ridges 220 is a positive Δ for first s-p polarization measurement 420 and first p-s polarization measurement 422, and a negative α for second p-s polarization measurement 424 and second s-p polarization measurement 426. Thus, a difference between these measurements can then be obtained (i.e., $ds=S_{1(s\text{-}p)}-S_{1(p\text{-}s)}+S_{2(s\text{-}p)}-S_{2(p\text{-}s)}$), which has double the sensitivity as compared to the difference between just first s-p polarization measurement 420 and first p-s polarization measurement 422 (i.e., $ds=S_{1(s\text{-}p)}-S_{1(p\text{-}s)}$). As described below, the difference between the cross polarization measurement can be used to determine the overlay error in forming ridges 208 and 220.

It should be noted, however, that the azimuthal angle Φ used in obtaining the cross polarization measurements can be altered by adjusting the position of the polarizing elements in polarizer 414 (FIG. 4-E). Additionally, one or more additional groups of polarizing elements can be disposed at different distances r and/or at different azimuthal angles to provide concurrent cross-polarization measurements for different polar angles. Furthermore, polarizer 414 can be implemented using various optical elements. For example, with reference to FIG. 4-D, polarizer 414 can be implemented as a stop with the polarizing elements placed in holes in the stop. Alternatively, polarizer 414 can be implemented as polarizing filters or foils placed on the blackened backside of focusing lens 406.

In one exemplary embodiment, cross polarization measurements can be obtained from a single location/site on grating 104. Thus, as described below, overlay measurements can be obtained by obtaining zero-order cross polarization measurements from a single location/site on grating 104. This has the advantage that the wafer does not need to be moved to obtain measurements from a second location/site on grating 104, which can increase throughput.

According to symmetry theorems, when grating 104 is illuminated obliquely and conically and offset $\Delta_1$ (FIG. 5-B) and $\Delta_2$ (FIG. 5-C) are equal in magnitude but opposite in direction, the zero-order cross polarization reflection coefficients are crosswise equivalent. Similarly, the zero-order cross polarization efficiencies are also crosswise equivalent.

More specifically, assume that grating 104, or any arbitrary periodic grating, is illuminated with a certain field size $E_i$ from an arbitrary incidence direction characterized by a wave vector $k_i$. Assume one of the propagating diffraction orders, which is characterized by the wave vector $k_1$, is detected and the diffracted electric field size $E_1$ (a complex value having an amplitude and a phase) is measured.

Now assume that the path of the light is reversed, i.e., the grating is illuminated from a direction opposite to those of the considered diffracted order $(-k_1)$ and the electric field $E_2$ of the diffraction order propagating in a direction $k_2$ opposite to the direction $k_i$ is detected $(k_2=-k_i)$. Assume further that the incident field has the same amplitude and phase as before. For example, if the grating had been earlier illuminated from the left side and the propagating diffraction order was detected on the right side, the path of the light is now reversed, i.e., the grating is now illuminated from the right side and the propagating diffraction order is detected on the left side.

Assuming that the grating is formed from isotropic materials, the reciprocity theorem states that:

$$E_1\cdot|k_{1y}|=E_2\cdot|k_{2y}|$$

where the $k_y$ are the wave vector components in normal direction. For zero order in reflection, the wave vector components are equal:

$$|k_{1y}|=|k_{2y}|$$

And thus:

$$E_1=E_2$$

Correspondingly, the diffraction coefficients r and the diffraction efficiencies η are also equal since they are derived from the electric field sizes of the diffracted waves.

$$r_{1,2}=E_{1,2}/E_i$$

$$\eta_{1,2}=c_{1,2}(k_{y1,2})\cdot r_{1,2}\cdot r_{1,2}^*$$

where c is a factor that depends on the wave vector component in normal direction and the asterisk denotes the conjugate complex value.

This applies also for polarization and cross polarization. For example, assume that the grating is first illuminated with s (i.e., TE) polarized light and the p (i.e., TM) polarized component is detected. Next, the grating is illuminated with p polarized light and the s polarized component is detected. Then, the following holds for the zero order:

$$E_{1,s\to p}=E_{2,p\to s} \text{ and } E_{1,p\to s}=E_{2,s\to p}$$

and for the derived complex coefficients and diffraction efficiencies. Note that the same would be true if the grating had been first illuminated with p polarized light and the s polarized component detected, then illuminated with s polarized light and the p polarized component detected.

As such, with reference to FIGS. 5-A, 5-B, and 5-C, assume that the first measurement is a zero-order cross polarization reflection coefficient from TE to TM (i.e., $r_{sp}$), and that the second measurement is a zero-order cross polarization reflection coefficient from TM to TE (i.e., $r_{ps}$). If offset $\Delta_1$ (FIG. 5-B) and $\Delta_2$ (FIG. 5-C) are equal in magnitude but opposite in direction, then the zero-order cross polarization reflection coefficients from TE to TM for ridges AB08 and AB18 offset by $\Delta_1$ (FIG. 5-B) is equivalent to the zero-order cross polarization reflection coefficients from TM to TE for ridges AB08 and AB18 offset by $\Delta_2$ (FIG. 5-C):

$$r_{sp}(\Delta_1)=r_{ps}(\Delta_2) \text{ and } r_{ps}(\Delta_1)=r_{sp}(\Delta_2)$$

where the subscript "sp" corresponds to TE to TM polarization, and subscript "ps" corresponds to TM to TE polarization. However, zero-order cross polarization reflection coefficient from TE to TM for ridges AB08 and AB18 offset by $\Delta_1$ (FIG. 5-B) is not equivalent to the reflection coefficient from TE to TM for ridges AB08 and AB18 offset by $\Delta_2$ (FIG. 5-C):

$$r_{sp}(\Delta_1) \neq r_{sp}(\Delta_2) \text{ and } r_{ps}(\Delta_1) \neq r_{ps}(\Delta_2)$$

It should be noted that the first measurement can be a zero-order cross polarization reflection coefficient from TM to TE (i.e., $r_{ps}$), and the second measurement can be a zero-order cross polarization reflection coefficient from TE to TM (i.e., $r_{sp}$). Additionally, as noted earlier, the two measurements can be zero-order cross polarization efficiencies rather than zero-order cross polarization reflection coefficients.

A difference between these two cross polarization measurements (i.e., $dr=r_{sp}-r_{ps}$ or $dr=r_{ps}-r_{sp}$) can then be obtained. If there is no overlay error, then ridges 208 and 218 are symmetrically positioned and the difference is zero. However, if there is an overlay error, then ridges 208 and 218 are not symmetrically positioned and the difference is not zero. More particularly, in the present example, if ridges 218 have shifted to the right of their symmetric position, the difference (i.e., $r_{sp}-r_{ps}$) is negative. If ridges 218 have shifted to the left of their symmetric position, the difference is positive.

In the present exemplary embodiment, response curves are generated by obtaining zero-order cross polarization measurements at various misalignments of ridges 208 and 218. For example, FIG. 6 depicts exemplary response curves of the zero-order reflection coefficient from TE to TM (i.e., $r_{13}$ sp) and zero-order reflection coefficient from TM to TE (i.e., $r_{13}$ ps) versus various misalignments of ridges 208 and 218 (FIGS. 5-B and 5C).

Figure 6:
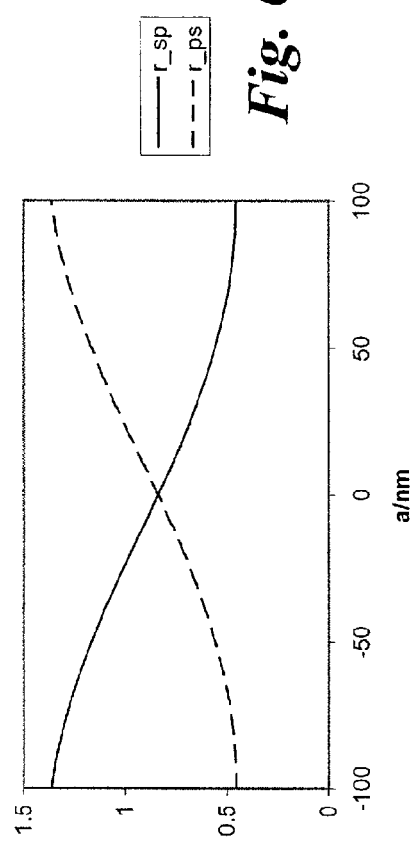
FIG. 6 depicts exemplary response curve.

In FIG. 6, a misalignment of zero (i.e., point 0 on the horizontal axis) corresponds to symmetric alignment between ridges 208 and 218 (i.e., when the spacing between a ridge 218 and ridge 208 on either side is equal, as depicted in FIG. 5-A). Positive misalignment (i.e., a point to the right of 0 on the horizontal axis) corresponds to ridge 218 shifted to the right of its symmetric alignment position (FIG. 5-B). Negative misalignment (i.e., a point to the left of 0 on the horizontal axis) corresponds to ridge 218 shifted to the left of its symmetric alignment position (FIG. 5-C).

As depicted in FIG. 6, in the present example, for negative misalignment, r_sp is greater than r_ps, and for positive misalignment r_ps is greater than r_sp. As such, when the difference between the cross polarization measurements is dr=r_ps–r_sp, the difference is positive for positive misalignment and negative for negative misalignment. However, as noted earlier, the difference between the cross polarization measurements can be determined as the difference between r_sp and r_ps, in which case the difference is negative for positive misalignment and positive for negative misalignment.

In the present exemplary embodiment, a calibration curve is generated based on differences between zero-order cross polarization measurements at various misalignments of ridges 208 and 218. For example, FIG. 7 depicts an exemplary calibration curve generated based on the difference between the response curves depicted in FIG. 6.

Figure 7:
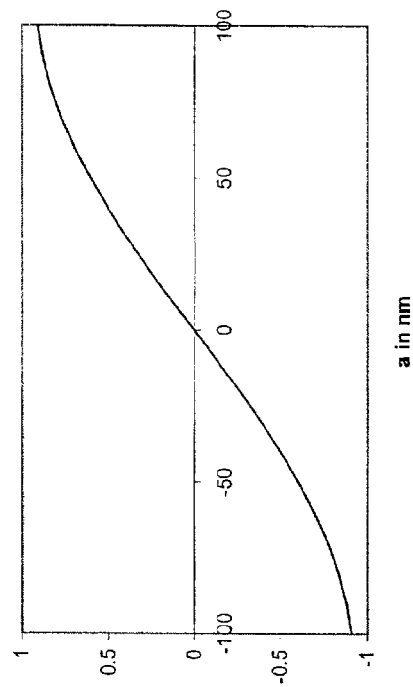
FIG. 7 depicts an exemplary calibration curve.

The response curves depicted in FIG. 6 and the calibration curve depicted in FIG. 7 were generated assuming an incidence angle $\theta_i$ of 65 degrees, an azimuthal angle $\Phi$ of 45 degrees, and a wavelength of 600 nm. Additionally, with reference to FIG. 5, ridges 208 were assumed to have a linewidth of 200 nm, a height of 500 nm, and formed from poly-silicon. Ridges 218 were assumed to have a linewidth of 200 nm, a height of 500 nm, and formed from resist. The pitch of ridges 208 and 218 was assumed to be 1 $\mu$m. It should be noted that these parameters can vary depending on the application.

It should be recognized that the response curve and/or calibration curve depicted in FIGS. 6 and 7 can be generated empirically or computed through modeling. Additionally, the relationship between misalignment and efficiency of the diffraction signal, as depicted in FIGS. 6 and 7, can be stored in various formats, such as a function, a table of data, and the like. Furthermore, this information can be accessed by optical metrology system 300 (FIG. 3) to obtain overlay measurements.

For example, with reference to FIG. 3, assume that one or more response curves and/or difference curves similar to that depicted in FIGS. 6 and 7 are generated and provided to metrology system 300. The response and calibration curves can be stored on a storage media, such as a hard drive, CD, and the like, or remotely accessed by optical metrology system 300. Additionally, as noted above, the response and calibration curves can be provided in various formats, such as a fiction, table of data, and the like.

Now assume that wafer 102 has been fabricated and that periodic grating 104 is to be examined to obtain overlay measurements. As described above, source 310 directs an oblique and conical incident signal at periodic grating 104. Detector 320 receives the zero-order diffraction signal 322A. As described above, the zero-order cross polarization measurements are then obtained. Signal-processing system 330 can then determine the presence and direction of misalignment based on the obtained measurements. Additionally, as described above, zero-order cross polarization measurements can be obtained from a single location/ site on periodic grating 104. As such, signal-processing system 330 can determine the presence and direction of misalignment without having to move wafer 102, which has the advantage of increasing throughput.

More specifically, signal-processing system 330 can compute a difference between the zero-order cross polarization measurements. The computed difference can then be compared to a calibration curve (FIG. 7) to determine the presence, direction, and/or amount of misalignment. Alternatively, signal-processing system 330 can compare the zero-order cross polarization measurements to a response curve (FIG. 6) to determine the presence, direction, and/or amount of misalignment. Signal-processing system 330 can include any convenient computer system configured to obtain overlay measurements from the zero-order cross polarization measurements, response curve, and/or calibration curve.

In another exemplary embodiment, with reference to FIG. 8-A, ridges 208 and 218 are formed from different material and have different heights. More particularly, in the present embodiment, ridges 218 are taller than ridges 208. It should be noted, however, that ridges 208 can be taller than ridges 218.

Ridges 208 are formed using a first mask, and ridges 218 are formed using a second mask. Additionally, as depicted in FIG. 8-A, when the first and second masks are properly aligned, ridges 208 and 218 are formed symmetrically aligned such that the spacing between a ridge 218 and a ridge 208 on either side is equal. However, if an overlay error exists, ridges 208 and 218 are formed asymmetrically aligned. For example, in FIG. 8-B, ridges 218 are depicted as being formed with an offset of $\Delta_1$ from their symmetrically aligned position. In FIG. 8-C, ridges 218 are depicted as being formed with an offset of $\Delta_2$ from their symmetrically aligned position.

As described above, to obtain overlay measurements, grating 104 is illuminated obliquely and conically. Zero-order cross polarization measurements are then obtained and can be used to determine the presence, direction, and/or amount of misalignment.

FIG. 9 depicts exemplary response curves of the zero-order reflection coefficient from TE to TM (i.e., r_sp) and zero-order reflection coefficient from TM to TE (i.e., r_ps) versus various misalignments of ridges 208 and 218 (FIGS. 8-B and 8-C). FIG. 10 depicts an exemplary calibration curve generated based on the difference between the response curves depicted in FIG. 9.

The response curves depicted in FIG. 9 and the calibration curve depicted in FIG. 10 were generated assuming an incidence angle $\theta_i$ of 65 degrees, an azimuthal angle $\Phi$ of 45 degrees, and a wavelength of 600 nm. Additionally, with reference to FIG. 8-A, ridges 208 were assumed to have a linewidth of 200 nm, a height of 200 nm, and formed from poly-silicon. Ridges 218 were assumed to have a linewidth of 200 nm, a height of 500 nm, and formed from resist. The pitch of ridges 208 and 218 was assumed to be 1 $\mu$m.

In another exemplary embodiment, with reference to FIG. 11-A, ridges 208 and 218 are formed from the same material and have different linewidths. More particularly, in the present embodiment, ridges 218 are wider than ridges 208. It should be noted, however, that ridges 208 can be wider than ridges 218.

As before, ridges 208 are formed using a first mask, and ridges 218 are formed using a second mask. Additionally, as depicted in FIG. 11-A, when the first and second masks are properly aligned, ridges 208 and 218 are formed symmetrically aligned such that the spacing between a ridge 218 and a ridge 208 on either side is equal. However, if an overlay error exists, ridges 208 and 218 are formed asymmetrically aligned. For example, in FIG. 11-B, ridges 218 are depicted as being formed with an offset of $\Delta_1$ from their symmetrically aligned position. In FIG. 11-C, ridges 218 are depicted as being formed with an offset of $\Delta_2$ from their symmetrically aligned position.

As described above, to obtain overlay measurements, grating 104 is illuminated obliquely and conically. Zero-order cross polarization measurements are then obtained and can be used to determine the presence, direction, and/or amount of misalignment.

FIG. 12 depicts exemplary response curves of the zero-order reflection coefficient from TE to TM (i.e., rem) and zero-order reflection coefficient from TM to TE (i.e., rme) versus various misalignments of ridges 208 and 218 (FIGS. 8-B and 8-C). FIG. 13 depicts an exemplary calibration curve generated based on the difference between the response curves depicted in FIG. 12.

The response curves depicted in FIG. 12 and the calibration curve depicted in FIG. 13 were generated assuming an incidence angle $\theta_i$ of 65 degrees, an azimuthal angle $\Phi$ of 45 degrees, and a wavelength of 600 nm. Additionally, with reference to FIG. 8-A, ridges 208 were assumed to have a linewidth of 300 nm, a height of 500 nm, and formed from resist. Ridges 218 were assumed to have a linewidth of 100 nm, a height of 500 nm, and formed from resist. The pitch of ridges 208 and 218 was assumed to be 1 $\mu$m.

Thus far, ridges 208 and 218 have been depicted as being pattered adjacent to each other. The proximity of ridges 208 to 218, however, can result in additional error in patterning ridges 218. This is generally known as "proximity error", and can reduce the accuracy of the overlay measurement.

Therefore, with reference to FIG. 14-A, in another exemplary embodiment, ridges 218 are patterned on ridges 208. As before, ridges 208 are formed using a first mask, and ridges 218 are formed using a second mask. In the present embodiment, when the first and second masks are properly aligned, ridges 218 and 208 are symmetrically aligned such that the centerlines of ridges 218 and 208 are aligned. However, if an overlay error exists, ridges 218 and 208 are asymmetrically aligned such that the centerlines of ridges 218 and 208 are not aligned. For example, in FIG. 14-B, ridges 218 are depicted as being formed with an offset of $\Delta_1$ from their symmetrically aligned position. In FIG. 14-C, ridges 218 are depicted as being formed with an offset of $\Delta_2$ from their symmetrically aligned position As described above, to obtain overlay measurements, grating 104 is illuminated obliquely and conically. Zero-order cross polarization measurements are then obtained and can be used to determine the presence, direction, and/or amount of misalignment.

Grating 104 can be illuminated using various azimuthal angles, incidence angles, and/or wavelength of light. Additionally, the response curves can be used to select a desirable azimuthal angle, incidence angle, and/or wavelength. More particularly, a number of response curves can be generated for various azimuthal angles, incidence angles, and/or wavelengths, then the setting that produces the response curve with the desirable characteristics can be selected.

For example, FIG. 15 depicts exemplary response curves of the zero-order reflection coefficient from TE to TM (i.e., r_sp) and zero-order reflection coefficient from TM to TE (i.e., r_ps) versus various misalignments of ridges 208 and 218 (FIGS. 14-B and 14-C). Additionally, with reference to FIG. 14-A, ridges 208 were assumed to have a linewidth of 800 nm, a height of 200 nm, and formed from poly-silicon. Ridges 218 were assumed to have a linewidth of 200 nm, a height of 500 nm, and formed from resist. The pitch of ridges 208 and 218 was assumed to be 1 $\mu$m.

The response curves depicted in FIG. 15 were generated assuming an incidence angle $\theta_i$ of 65 degrees, azimuthal angles $\Phi$ of 30 and 45 degrees, and a wavelength of 600 nm. As can be seen from FIG. 15, the response curve with the azimuthal angle of 45 degrees has greater sensitive (i.e., steeper slopes) than azimuthal angle of 30 degrees. Thus, the calibration curve depicted in FIG. 16 was generated based on the response curves depicted in FIG. 15 for azimuthal angle $\Phi$ of 45 degrees.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching.

We claim:

1. A method of obtaining overlay measurements for a semiconductor wafer, the method comprising:

forming a periodic grating on the wafer having:
  a first set of gratings,
    wherein the first set of gratings are formed on the wafer using a first mask, and
  a second set of gratings,
    wherein the second set of gratings are formed on the wafer using a second mask;
  obtaining zero-order cross polarization measurements of a portion of the periodic grating after forming the first and second sets of gratings; and
  determining any overlay error between the first and second masks used to form the first and second sets of gratings based on the obtained zero-order cross polarization measurements.

2. The method of claim 1, wherein obtaining zero-order cross polarization measurements comprises:
  obtaining a first zero-order cross polarization measurement; and
  obtaining a second zero-order cross polarization measurement,
    wherein the second zero-order cross polarization measurement has a polarization opposite that of the first zero-order cross polarization measurement.

3. The method of claim 2, wherein the first and second zero-order cross polarization measurements are obtained from the same site on the periodic grating.

4. The method of claim 3, wherein the first and second zero-order cross polarization measurements are obtained concurrently.

5. The method of claim 4,
  wherein the first and second zero-order cross polarization measurements are obtained using a polarizer and an analyzer,
  wherein the polarizer and the analyzer each have an s-polarizing portion and a p-polarizing portion,
  wherein the first zero-order cross polarization measurement is obtained using the s-polarizing portion of the polarizer and the p-polarizing portion of the analyzer; and
  wherein the second zero-order cross polarization measurement is obtained using the p-polarizing portion of the polarizer and the s-polarizing portion of the analyzer.

6. The method of claim 4,
  wherein the first and second zero-order cross polarization measurements are obtained using:
  an optical path normal to the periodic grating, and
  a polarizer having at least one set of polarizing elements disposed at a distance from the optical path.

7. The method of claim 6,
  wherein the at least one set of polarizing elements includes:
  a first s-polarizing element,
  a second s-polarizing element,
  a first p-polarizing element, and
  a second p-polarizing element;
  wherein the first zero-order cross polarization measurement is obtained using the first s-polarizing element and the first p-polarizing element;
  wherein the second zero-order cross polarization measurement is obtained using the second p-polarizing element and the second s-polarizing element.

8. The method of claim 2, wherein determining any overlay error comprises:
  comparing the difference between the first zero-order cross polarization measurement and the second zero-order cross polarization measurement,
  wherein an overlay error exists between the first and second masks when there is a difference between the first and second zero-order cross polarization measurements.

9. The method of claim 2 further comprising:
  obtaining a set of first zero-order cross polarization measurements for a range of possible misalignments between the first and second masks; and
  obtaining a set of second zero-order cross polarization measurements for a range of possible misalignments between the first and second masks.

10. The method of claim 9 further comprising:
  generating a first response curve based on the set of first zero-order cross polarization measurements,
    wherein the first response curve characterizes a relationship between the different possible misalignments of the first and second masks and the set of first zero-order cross polarization measurements; and
  generating a second response curve based on the set of second zero-order cross polarization measurements,
    wherein the second response curve characterizes a relationship between the different possible misalignments of the first and second masks and the set of second zero-order cross polarization measurements.

11. The method of claim 10 further comprising:
  generating a plurality of response curves using various wavelengths and/or azimuthal angles; and
  selecting a desirable wavelength and/or azimuthal angle based on the generated response curves.

12. The method of claim 10, wherein the response curves are generated empirically.

13. The method of claim 10, wherein the response curves are generated using modeling.

14. The method of claim 10, wherein determining any overlay error comprises:
  comparing the difference between the obtained first and second zero-order cross polarization measurements to the differences between the first and second response curves at the different possible misalignments between the first and second masks.

15. The method of claim 10 further comprising:
  generating a calibration curve based on the response curves,
  wherein the calibration curve characterizes a relationship between the different possible misalignments of the first and second masks and differences between the first and second response curves.

16. The method of claim 15, wherein determining any overlay error comprises:
  comparing the difference between the obtained first and second zero-order cross polarization measurements to the calibration curve.

17. The method of claim 2, wherein the first and second zero-order cross polarization measurements include zero-order cross polarization efficiencies or zero-order cross polarization reflection coefficients.

18. The method of claim 2, wherein the first zero-order cross polarization measurement includes TE polarization and the second zero-order cross polarization measurement includes TM polarization.

19. The method of claim 2, wherein the first zero-order cross polarization measurement includes TM polarization and the second zero-order cross polarization measurement includes TE polarization.

20. The method of claim 1, wherein the zero-order cross polarization measurements are obtained using an optical metrology system.

21. The method of claim 20, wherein the optical metrology system includes a reflectometer.

22. The method of claim 20, wherein the optical metrology system includes an ellipsometer.

23. The method of claim 22, wherein the ellipsometer includes:
a polarizer; and
an analyzer,
wherein the polarizer and the analyzer are set to a first angular setting to obtain a first zero-order cross polarization measurement, and
wherein the polarizer and the analyzer are set to a second angular setting to obtain a second zero-order cross polarization measurement.

24. The method of claim 22, wherein the ellipsometer includes:
a polarizer having an s-polarizing portion and a p-polarizing portion; and
an analyzer having an s-polarizing portion and a p-polarizing portion,
wherein a first zero-order cross polarization measurement is obtained using the s-polarizing portion of the polarizer and the p-polarizing portion of the analyzer, and
wherein a second zero-order cross polarization measurement is obtained using the p-polarizing portion of the polarizer and the s-polarizing portion of the analyzer.

25. The method of claim 20, wherein the zero-order cross polarization measurements are obtained using:
an optical path normal to the periodic grating, and
a polarizer having at least one set of polarizing elements disposed at a distance from the optical path.

26. The method of claim 25,
wherein the at least one set of polarizing elements includes:
a first s-polarizing element,
a second s-polarizing element,
a first p-polarizing element, and
a second p-polarizing element;
wherein a first zero-order cross polarization measurement is obtained using the first s-polarizing element and the first p-polarizing element;
wherein a second zero-order cross polarization measurement is obtained using the second p-polarizing element and the second s-polarizing element.

27. The method of claim 1,
wherein the first and second sets of gratings include a plurality of ridges that repeat at a periodic interval, and
wherein the ridges of the first and second sets of gratings alternate.

28. The method of claim 27,
wherein the ridges of the first and second sets of grating include centerlines having a spacing between the centerlines of the ridges of the first and second sets of gratings; and
wherein the first and second sets of gratings are formed with the spacing between the centerlines uniform when the first and second masks are aligned without an overlay error.

29. The method of claim 1,
wherein the first and second sets of gratings include a plurality of ridges that repeat at a periodic interval, and
wherein the ridges of the second set of gratings are formed on the ridges of the first set of gratings.

30. The method of claim 29,
wherein the ridges of the first and second sets of gratings include centerlines, and
wherein the first and second sets of gratings are formed with the centerlines of the ridges aligned when the first and second masks are aligned without an overlay error.

31. The method of claim 1, wherein the periodic grating is formed from isotropic materials.

32. The method of claim 1, wherein the zero-order cross polarization measurements are obtained using an oblique and conical incident signal.

33. The method of claim 1, wherein the first and second sets of gratings are formed from different materials and have the same height.

34. The method of claim 1, wherein the first and second sets of gratings are formed from different materials and have different heights.

35. The method of claim 1, wherein the first and second sets of gratings are formed from the same material and have different linewidths.

36. A method of obtaining overlay measurements for a semiconductor wafer, the method comprising:
forming a periodic grating on the wafer having:
a first set of periodic gratings, and
a second set of periodic gratings,
wherein the first and second sets of periodic gratings are formed using separate masks;
obtaining zero-order cross polarization measurements from the periodic grating after forming the first and second sets of gratings,
wherein the zero-order cross polarization measurements are obtained using an oblique and conical incident angle; and
determining any overlay error associated with the formation of the first and second sets of gratings based on the obtained zero-order cross polarization measurements.

37. The method of claim 36, wherein obtaining zero-order cross polarization measurements comprises:
obtaining a first zero-order cross polarization measurement; and
obtaining a second zero-order cross polarization measurement,
wherein the second zero-order cross polarization measurement has a polarization opposite that of the first zero-order cross polarization measurement.

38. The method of claim 37, wherein the first and second zero-order cross polarization measurements are obtained concurrently from the same site on the periodic grating.

39. The method of claim 37, wherein determining any overlay error comprises:
comparing the difference between the first zero-order cross polarization measurement and the second zero-order cross polarization measurement,
wherein an overlay error exists when there is a difference between the first and second zero-order cross polarization measurements.

40. The method of claim 37, wherein the first and second zero-order cross polarization measurements include zero-order cross polarization efficiencies or zero-order cross polarization reflection coefficients.

41. The method of claim 37, wherein the first zero-order cross polarization measurement includes TE polarization and the second zero-order cross polarization measurement includes TM polarization.

42. The method of claim 37, wherein the first zero-order cross polarization measurement includes TM polarization and the second zero-order cross polarization measurement includes TE polarization.

43. The method of claim 37, wherein the first and second zero-order cross polarization measurements are obtained from a single site on the periodic grating.

44. The method of claim 37 further comprising:
obtaining a set of first zero-order cross polarization measurements for a range of possible misalignments between the first and second gratings; and
obtaining a set of second zero-order cross polarization measurements for a range of possible misalignments between the first and second gratings.

45. The method of claim 44 further comprising:
generating a first response curve based on the set of first zero-order cross polarization measurements; and
generating a second response curve based on the set of second zero-order cross polarization measurements,
wherein the first and second response curves characterize a relationship between the different possible misalignments of the first and second gratings and the zero-order cross polarization measurements.

46. The method of claim 45, wherein determining any overlay error comprises:
comparing any difference between the obtained first and second zero-order cross polarization measurements to the differences between the first and second response curves at the different possible misalignments of the first and second gratings.

47. The method of claim 45 further comprising:
generating a calibration curve based on the response curves,
wherein the calibration curve characterizes a relationship between the different possible misalignments of the first and second gratings and differences between the first and second response curves.

48. The method of claim 47, wherein determining any overlay error comprises:
comparing any difference between the obtained first and second zero-order cross polarization measurements to the calibration curve.

49. The method of claim 36, wherein the zero-order cross polarization measurements are obtained using an ellipsometer having:
a polarizer; and
an analyzer,
wherein the polarizer and the analyzer are set to a first angular setting to obtain a first zero-order cross polarization measurement, and
wherein the polarizer and the analyzer are set to a second angular setting to obtain a second zero-order cross polarization measurement.

50. The method of claim 36, wherein the zero-order cross polarization measurements are obtained using an ellipsometer having:
a polarizer having an s-polarizing portion and a p-polarizing portion; and
an analyzer having an s-polarizing portion and a p-polarizing portion,
wherein a first zero-order cross polarization measurement is obtained using the s-polarizing portion of the polarizer and the p-polarizing portion of the analyzer, and
wherein a second zero-order cross polarization measurement is obtained using the p-polarizing portion of the polarizer and the s-polarizing portion of the analyzer.

51. The method of claim 36, wherein the zero-order cross polarization measurements are obtained using:
an optical path normal to the periodic grating, and
a polarizer having:
a first s-polarizing element,
a second s-polarizing element,
a first p-polarizing element, and
a second p-polarizing element;
wherein a first zero-order cross polarization measurement is obtained using the first s-polarizing element and the first p-polarizing element;
wherein a second zero-order cross polarization measurement is obtained using the second p-polarizing element and the second s-polarizing element;
wherein a third zero-order cross polarization measurement is obtained using the first p-polarizing element and the first s-polarizing element;
wherein a fourth zero-order cross polarization measurement is obtained using the second s-polarizing element and the second p-polarizing element; and
wherein a difference is determined between the first, second, third, and fourth zero-order cross polarization measurements to determine any overlay error.

52. The method of claim 36,
wherein the first and second sets of gratings include a plurality of ridges that repeat at a periodic interval, and
wherein the ridges of the first and second sets of gratings alternate.

53. The method of claim 52,
wherein the ridges of the first and second sets of grating include centerlines having a spacing between the centerlines of the ridges of the first and second sets of gratings; and
wherein the first and second sets of gratings are formed with the spacing between the centerlines nonuniform when an overlay error exists.

54. The method of claim 36,
wherein the first and second sets of gratings include a plurality of ridges that repeat at a periodic interval, and
wherein the ridges of the second set of gratings are formed on the ridges of the first set of gratings.

55. The method of claim 54,
wherein the ridges of the first and second sets of gratings include centerlines, and
wherein the first and second sets of gratings are formed with the centerlines of the ridges misaligned when an overlay error exists.

56. The method of claim 36, wherein the periodic grating is formed from isotropic materials.

57. A method of obtaining overlay measurements for a semiconductor wafer having a periodic grating with a first set of gratings and a second set of gratings, the method comprising:
obtaining a first zero-order cross polarization measurement from the periodic grating; and
obtaining a second zero-order cross polarization measurement from the periodic grating,
wherein the first and second zero-order cross polarization measurements are obtained using an oblique and conical incident angle,
wherein the first and second zero-order cross polarization measurements are obtained from a single site on the periodic grating, and
wherein the second zero-order cross polarization measurement has a polarization opposite that of the first zero-order cross polarization measurement; and determining any overlay error associated with the formation of the first and second sets of gratings based on the obtained first and second zero-order cross polarization measurements.

58. The method of claim 57, wherein the first and second zero-order cross polarization measurements are obtained concurrently.

59. The method of claim 57, wherein determining any overlay error comprises:
comparing the difference between the first zero-order cross polarization measurement and the second zero-order cross polarization measurement,
wherein an overlay error exists when there is a difference between the first and second zero-order cross polarization measurements.

60. The method of claim 57, wherein the first and second zero-order cross polarization measurements include zero-order cross polarization efficiencies or zero-order cross polarization reflection coefficients.

61. The method of claim 57, wherein the first zero-order cross polarization measurement includes TE polarization and the second zero-order cross polarization measurement includes TM polarization.

62. The method of claim 57, wherein the first zero-order cross polarization measurement includes TM polarization and the second zero-order cross polarization measurement includes TE polarization.

63. The method of claim 57, wherein the periodic grating is formed from isotropic materials.

64. The method of claim 57 further comprising:
obtaining a set of first zero-order cross polarization measurements for a range of possible misalignments between the first and second gratings; and
obtaining a set of second zero-order cross polarization measurements for a range of possible misalignments between the first and second gratings.

65. The method of claim 64 further comprising:
generating a first response curve based on the set of first zero-order cross polarization measurements; and
generating a second response curve based on the set of second zero-order cross polarization measurements,
wherein the first and second response curves characterize a relationship between the different possible misalignments of the first and second gratings and the zero-order cross polarization measurements.

66. The method of claim 65, wherein determining any overlay error comprises:
comparing any difference between the obtained first and second zero-order cross polarization measurements to the differences between the first and second response curves at the different possible misalignments of the first and second gratings.

67. The method of claim 65 further comprising:
generating a calibration curve based on the response curves,
wherein the calibration curve characterizes a relationship between the different possible misalignments of the first and second gratings and differences between the first and second response curves.

68. The method of claim 67, wherein determining any overlay error comprises:
comparing any difference between the obtained first and second zero-order cross polarization measurements to the calibration curve.

69. The method of claim 57, wherein the first and second zero-order cross polarization measurements are obtained using an ellipsometer having:
a polarizer; and
an analyzer,
wherein the polarizer and the analyzer are set to a first angular setting to obtain the first zero-order cross polarization measurement, and
wherein the polarizer and the analyzer are set to a second angular setting to obtain the second zero-order cross polarization measurement.

70. The method of claim 57, wherein the first and second zero-order cross polarization measurements are obtained using an ellipsometer having:
a polarizer having an s-polarizing portion and a p-polarizing portion; and
an analyzer having an s-polarizing portion and a p-polarizing portion,
wherein the first zero-order cross polarization measurement is obtained using the s-polarizing portion of the polarizer and the p-polarizing portion of the analyzer, and
wherein the second zero-order cross polarization measurement is obtained using the p-polarizing portion of the polarizer and the s-polarizing portion of the analyzer.

71. The method of claim 57, wherein the first and second zero-order cross polarization measurements are obtained using:
an optical path normal to the periodic grating, and
a polarizer having at least one set of polarizing elements disposed at a distance from the optical path.

72. The method of claim 71,
wherein the at least one set of polarizing elements includes:
a first s-polarizing element,
a second s-polarizing element,
a first p-polarizing element, and
a second p-polarizing element;
wherein the first zero-order cross polarization measurement is obtained using the first s-polarizing element and the first p-polarizing element;
wherein the second zero-order cross polarization measurement is obtained using the second p-polarizing element and the second s-polarizing element.

73. The method of claim 72 further comprising:
obtaining a third zero-order cross polarization measurement is obtained using the first p-polarizing element and the first s-polarizing element;
obtaining a fourth zero-order cross polarization measurement is obtained using the second s-polarizing element and the second p-polarizing element;
wherein the first, second, third, and fourth zero-order cross polarization measurements are obtained from a single site on the periodic grating; and
wherein a difference is determined between the first, second, third, and fourth zero-order cross polarization measurements to determine any overlay error.

74. A system to obtain overlay measurements of a semiconductor wafer, the system comprising:
a periodic grating formed on the wafer comprising:
a first set of gratings formed using a first mask,
a second set of gratings formed using a second mask; and
an optical metrology system configured to:
obtain zero-order cross polarization measurements from the periodic grating after the first and second sets of gratings are formed on the wafer, and determine any overlay error between the first and second masks used to form the first and second sets of gratings based on the obtained zero-order cross polarization measurements.

75. The system of claim 74, wherein the optical metrology system is configured to:
obtain a first zero-order cross polarization measurement; and
obtain a second zero-order cross polarization measurement,
wherein the second zero-order cross polarization measurement has a polarization opposite that of the first zero-order cross polarization measurement.

76. The system of claim 75, wherein the first and second zero-order cross polarization measurements are obtained from the same site on the periodic grating.

77. The system of claim 76, wherein the first and second zero-order cross polarization measurements are obtained concurrently.

78. The system of claim 75, wherein the optical metrology system is configured to:
compare the difference between the first zero-order cross polarization measurement and the second zero-order cross polarization measurement,
wherein an overlay error exists when there is a difference between the first and second zero-order cross polarization measurements.

79. The system of claim 75, wherein the first and second zero-order cross polarization measurements include zero-order cross polarization efficiencies or zero-order cross polarization reflection coefficients.

80. The system of claim 75, wherein the first zero-order cross polarization measurement includes TE polarization and the second zero-order cross polarization measurement includes TM polarization.

81. The system of claim 75, wherein the first zero-order cross polarization measurement includes TM polarization and the second zero-order cross polarization measurement includes TE polarization.

82. The system of claim 74, wherein the optical metrology system includes a reflectometer.

83. The system of claim 74, wherein the optical metrology system includes an ellipsometer.

84. The system of claim 83, wherein the ellipsometer includes:
a polarizer; and
an analyzer,
wherein the polarizer and the analyzer are set to a first angular setting to obtain a first zero-order cross polarization measurement, and
wherein the polarizer and the analyzer are set to a second angular setting to obtain a second zero-order cross polarization measurement.

85. The system of claim 84, wherein the ellipsometer includes:
a polarizer having an s-polarizing portion and a p-polarizing portion; and
an analyzer having an s-polarizing portion and a p-polarizing portion,
wherein a first zero-order cross polarization measurement is obtained using the s-polarizing portion of the polarizer and the p-polarizing portion of the analyzer, and
wherein a second zero-order cross polarization measurement is obtained using the p-polarizing portion of the polarizer and the s-polarizing portion of the analyzer.

86. The system of claim 74, wherein the optical metrology system includes:
a polarizer having:
an optical path normal to the periodic grating; and
at least one set of polarizing elements disposed at a distance from the optical path.

87. The system of claim 86,
wherein the at least one set of polarizing elements includes:
a first s-polarizing element,
a second s-polarizing element,
a first p-polarizing element, and
a second p-polarizing element;
wherein a first zero-order cross polarization measurement is obtained using the first s-polarizing element and the first p-polarizing element;
wherein a second zero-order cross polarization measurement is obtained using the second p-polarizing element and the second s-polarizing element.

88. The system of claim 74,
wherein the first and second sets of gratings include a plurality of ridges that repeat at a periodic interval, and
wherein the ridges of the first and second sets of gratings alternate.

89. The system of claim 88,
wherein the ridges of the first and second sets of grating include centerlines having a spacing between the centerlines of the ridges of the first and second sets of gratings; and
wherein the first and second sets of gratings are formed with the spacing between the centerlines uniform when the first and second masks are aligned without an overlay error.

90. The system of claim 74,
wherein the first and second sets of gratings include a plurality of ridges that repeat at a periodic interval, and
wherein the ridges of the second set of gratings are formed on the ridges of the first set of gratings.

91. The system of claim 90,
wherein the ridges of the first and second sets of gratings include centerlines, and
wherein the first and second sets of gratings are formed with the centerlines of the ridges aligned when the first and second masks are aligned without an overlay error.

92. The system of claim 74, wherein the periodic grating is formed from isotropic materials.

93. The system of claim 74, wherein the optical metrology system obtains the zero-order cross polarization measurements using an oblique and conical incident signal.

94. A system to obtain overlay measurements of a semiconductor wafer having a periodic grating with a first set of gratings and a second set of gratings, the system comprising:
an optical metrology system configured to:
obtain a first zero-order cross polarization measurement from a site on the periodic grating;
obtain a second zero-order cross polarization measurement from the same site on the periodic grating as the first zero-order cross polarization measurement; and
determine any overlay error associated with the formation of the first and second sets of gratings based on the obtained first and second zero-order cross polarization measurements.

95. The system of claim 94, wherein the optical metrology system includes:

a polarizer; and an analyzer, wherein the polarizer and the analyzer are set to a first angular setting to obtain the first zero-order cross polarization measurement, and wherein the polarizer and the analyzer are set to a second angular setting to obtain the second zero-order cross polarization measurement.

96. The system of claim 94, wherein the optical metrology system includes:

a polarizer having an s-polarizing portion and a p-polarizing portion; and an analyzer having an s-polarizing portion and a p-polarizing portion, wherein the first zero-order cross polarization measurement is obtained using the s-polarizing portion of the polarizer and the p-polarizing portion of the analyzer, and wherein the second zero-order cross polarization measurement is obtained using the p-polarizing portion of the polarizer and the s-polarizing portion of the analyzer.

97. The system of claim 94, wherein the optical metrology system includes:

a polarizer having:

an optical path normal to the periodic grating;

a first s-polarizing element;

a second s-polarizing element;

a first p-polarizing element; and a second p-polarizing element, wherein the first zero-order cross polarization measurement is obtained using the first s-polarizing element and the first p-polarizing element, and wherein the second zero-order cross polarization measurement is obtained using the second p-polarizing element and the second s-polarizing element.

98. The system of claim 94, wherein the first and second zero-order cross polarization measurements are obtained concurrently.

99. The system of claim 94, wherein the optical metrology system is configured to:

compare the difference between the first zero-order cross polarization measurement and the second zero-order cross polarization measurement, wherein an overlay error exists when there is a difference between the first and second zero-order cross polarization measurements.

100. The system of claim 94, wherein the first and second zero-order cross polarization measurements include zero-order cross polarization efficiencies or zero-order cross polarization reflection coefficients.

101. The system of claim 94, wherein the periodic grating is formed from isotropic materials.

102. The system of claim 94, wherein the optical metrology system obtains the zero-order cross polarization measurements using an oblique and conical incident signal.

103. A computer-readable storage medium containing computer executable instructions for causing a computer to obtain overlay measurements for a semiconductor wafer, comprising instructions for:

obtaining zero-order cross polarization measurements from a periodic grating formed on the wafer, wherein a first set of gratings of the periodic grating are formed on the wafer using a first mask, and wherein a second set of gratings of the periodic grating are formed on the wafer using a second mask; and determining any overlay error between the first mask and the second mask used to form the first and second sets of gratings based on the obtained zero-order cross polarization measurements.

104. The computer-readable storage medium of claim 103, wherein obtaining zero-order cross polarization measurements comprises:

obtaining a first zero-order cross polarization measurement; and obtaining a second zero-order cross polarization measurement, wherein the second zero-order cross polarization measurement has a polarization opposite that of the first zero-order cross polarization measurement.

105. The computer-readable storage medium of claim 104, wherein the first and second zero-order cross polarization measurements are obtained currently from the same site on the periodic grating.

106. The computer-readable storage medium of claim 104, wherein determining any overlay error comprises:

comparing the difference between the first zero-order cross polarization measurement and the second zero-order cross polarization measurement, wherein an overlay error exists between the first and second masks when there is a difference between the first and second zero-order cross polarization measurements.

107. The computer-readable storage medium of claim 104 further comprising:

obtaining a set of first zero-order cross polarization measurements for a range of possible misalignments between the first and second masks; and obtaining a set of second zero-order cross polarization measurements for a range of possible misalignments between the first and second masks.

108. The computer-readable storage medium of claim 107 further comprising:

generating a first response curve based on the set of first zero-order cross polarization measurements, wherein the first response curve characterizes a relationship between the different possible misalignments of the first and second masks and the set of first zero-order cross polarization measurements; and generating a second response curve based on the set of second zero-order cross polarization measurements, wherein the second response curve characterizes a relationship between the different possible misalignments of the first and second masks and the set of second zero-order cross polarization measurements.

109. The computer-readable storage medium of claim 108 further comprising:

generating a plurality of response curves using various wavelengths and/or azimuthal angles; and selecting a desirable wavelength and/or azimuthal angle based on the generated response curves.

110. The computer-readable storage medium of claim 108, wherein determining any overlay error comprises:

comparing the difference between the obtained first and second zero-order cross polarization measurements to the differences between the first and second response curves at the different possible misalignments between the first and second masks.

111. The computer-readable storage medium of claim 108, further comprising:

generating a calibration curve based on the response curves, wherein the calibration curve characterizes a relationship between the different possible misalignments of the first and second masks and differences between the first and second response curves.

112. The computer-readable storage medium of claim 111, wherein determining any overlay error comprises:

comparing the difference between the obtained first and second zero-order cross polarization measurements to the calibration curve.

113. The computer-readable storage medium of claim 104, wherein the first and second zero-order cross polarization measurements include zero-order cross polarization efficiencies or zero-order cross polarization reflection coefficients.

114. The computer-readable storage medium of claim 104, wherein the first zero-order cross polarization measurement includes TE polarization and the second zero-order cross polarization measurement includes TM polarization.

115. The computer-readable storage medium of claim 104, wherein the first zero-order cross polarization measurement includes TM polarization and the second zero-order cross polarization measurement includes TE polarization.

116. The computer-readable storage medium of claim 104, wherein the first and second zero-order cross polarization measurements are obtained from a single site on the periodic grating.

* * * * *